United States Patent
Mishra et al.

(10) Patent No.: US 12,203,166 B2
(45) Date of Patent: Jan. 21, 2025

(54) APPARATUS AND METHODS FOR PERFORMING AN IN-SITU ETCH OF REACTION CHAMBERS WITH FLUORINE-BASED RADICALS

(71) Applicant: ASM IP Holding B.V., Almere (NL)

(72) Inventors: Amit Mishra, Tempe, AZ (US); Bhushan Zope, Phoenix, AZ (US); Shankar Swaminathan, Phoenix, AZ (US); Theodorus G. M. Oosterlaken, Oudewater (NL)

(73) Assignee: ASM IP Holding B.V., Almere (NL)

( * ) Notice: Subject to any disclaimer, the term of this patent is extended or adjusted under 35 U.S.C. 154(b) by 577 days.

(21) Appl. No.: 17/307,007

(22) Filed: May 4, 2021

(65) Prior Publication Data

US 2021/0348271 A1    Nov. 11, 2021

Related U.S. Application Data

(60) Provisional application No. 63/021,514, filed on May 7, 2020.

(51) Int. Cl.
*C23C 16/44*    (2006.01)
*C23C 16/06*    (2006.01)
(Continued)

(52) U.S. Cl.
CPC .......... *C23C 16/4408* (2013.01); *C23C 16/06* (2013.01); *C23C 16/4405* (2013.01);
(Continued)

(58) Field of Classification Search
CPC . C23C 16/4408; C23C 16/06; C23C 16/4405; C23C 16/45536; C23C 16/52; C23C 16/452; C23C 16/14; C23C 16/34; C23C 16/45553; C23C 16/505; H01J 37/32862; H01J 37/32357; C23F 1/12
See application file for complete search history.

(56) References Cited

U.S. PATENT DOCUMENTS 2,059,480 A    11/1936    Obermaier
2,161,626 A     6/1939    Loughner et al.
(Continued)

FOREIGN PATENT DOCUMENTS

CN    101047143    10/2007
CN    101308794     9/2010
(Continued)

OTHER PUBLICATIONS

JP-2018011007-A, Machine Translation, Abstract. (Year: 2023).*
(Continued)

*Primary Examiner* — Binh X Tran
*Assistant Examiner* — Christopher Remavege
(74) *Attorney, Agent, or Firm* — Snell & Wilmer L.L.P.

(57) ABSTRACT

An apparatus and method for cleaning or etching a molybdenum film or a molybdenum nitride film from an interior of a reaction chamber in a reaction system are disclosed. A remote plasma unit is utilized to activate a halide precursor mixed with an inert gas source to form a radical gas. The radical gas reacts with the molybdenum film or the molybdenum nitride film to form a by-product that is removed from the interior of the reaction chamber by a purge gas.

16 Claims, 3 Drawing Sheets

(51) Int. Cl.
*C23C 16/455* (2006.01)
*C23C 16/52* (2006.01)
*H01J 37/32* (2006.01)

(52) U.S. Cl.
CPC ........ *C23C 16/45536* (2013.01); *C23C 16/52* (2013.01); *H01J 37/32862* (2013.01)

(56) References Cited

U.S. PATENT DOCUMENTS

| | | |
|---|---|---|
| 2,240,163 A | 4/1941 | Pick |
| 2,266,416 A | 12/1941 | Duclos |
| 2,280,778 A | 4/1942 | Andersen |
| 2,410,420 A | 11/1946 | Bennett |
| 2,441,253 A | 5/1948 | Sarver |
| 2,480,557 A | 8/1949 | Cummins |
| 2,563,931 A | 8/1951 | Harrison |
| 2,660,061 A | 11/1953 | Lewis |
| 2,745,640 A | 5/1956 | Cushman |
| 2,847,320 A | 8/1958 | Bulloff |
| 2,990,045 A | 6/1961 | Root |
| 3,038,951 A | 6/1962 | Mead |
| 3,089,507 A | 5/1963 | Drake et al. |
| 3,094,396 A | 6/1963 | Flugge et al. |
| 3,197,682 A | 7/1965 | Klass et al. |
| 3,232,437 A | 2/1966 | Hultgren |
| 3,263,502 A | 8/1966 | Springfield |
| 3,332,286 A | 7/1967 | Strong |
| 3,410,349 A | 11/1968 | Troutman |
| 3,420,622 A | 1/1969 | Donges et al. |
| 3,588,192 A | 6/1971 | Drutchas et al. |
| 3,634,740 A | 1/1972 | Stevko |
| 3,647,387 A | 3/1972 | Benson |
| 3,647,716 A | 3/1972 | Koches |
| 3,713,899 A | 1/1973 | Sebestyen |
| 3,718,429 A | 2/1973 | Williamson |
| 3,796,182 A | 3/1974 | Rosler |
| 3,814,128 A | 6/1974 | Grantham |
| 3,833,492 A | 9/1974 | Bollyky |
| 3,854,443 A | 12/1974 | Baerg |
| 3,862,397 A | 1/1975 | Anderson et al. |
| 3,867,205 A | 2/1975 | Schley |
| 3,885,504 A | 5/1975 | Baermann |
| 3,887,790 A | 6/1975 | Ferguson |
| 3,904,371 A | 9/1975 | Neti |
| 3,913,058 A | 10/1975 | Nishio et al. |
| 3,913,617 A | 10/1975 | van Laar |
| 3,916,270 A | 10/1975 | Wachtler et al. |
| 3,947,685 A | 3/1976 | Meinel |
| 3,960,559 A | 6/1976 | Suzuki |
| 3,962,004 A | 6/1976 | Sonneborn |
| 3,983,401 A | 9/1976 | Livesay |
| 3,997,638 A | 12/1976 | Manning et al. |
| 4,048,110 A | 9/1977 | Vanderspurt |
| 4,054,071 A | 10/1977 | Patejak |
| 4,058,430 A | 11/1977 | Suntola et al. |
| 4,079,944 A | 3/1978 | Durley et al. |
| 4,093,491 A | 6/1978 | Whelpton et al. |
| 4,099,041 A | 7/1978 | Berkman et al. |
| 4,126,027 A | 11/1978 | Smith et al. |
| 4,134,425 A | 1/1979 | Gussefeld et al. |
| 4,145,699 A | 3/1979 | Hu et al. |
| 4,149,237 A | 4/1979 | Freitas |
| 4,152,760 A | 5/1979 | Freitas et al. |
| 4,157,751 A | 6/1979 | Grundken et al. |
| 4,164,959 A | 8/1979 | Wurzburger |
| 4,176,630 A | 12/1979 | Elmer |
| 4,179,530 A | 12/1979 | Koppl et al. |
| 4,181,330 A | 1/1980 | Kojima |
| 4,184,188 A | 1/1980 | Briglia |
| 4,194,536 A | 3/1980 | Stine et al. |
| 4,217,463 A | 8/1980 | Swearingen |
| 4,229,064 A | 10/1980 | Vetter et al. |
| 4,234,449 A | 11/1980 | Wolson et al. |
| 4,241,000 A | 12/1980 | McCauley et al. |
| 4,314,763 A | 2/1982 | Steigmeier et al. |
| 4,322,592 A | 3/1982 | Martin |
| 4,324,611 A | 4/1982 | Vogel et al. |
| 4,333,735 A | 6/1982 | Hardy |
| 4,355,912 A | 10/1982 | Haak |
| 4,384,918 A | 5/1983 | Abe |
| 4,389,973 A | 6/1983 | Suntola et al. |
| 4,393,013 A | 7/1983 | McMenamin |
| 4,401,507 A | 8/1983 | Engle |
| 4,412,133 A | 10/1983 | Eckes et al. |
| 4,413,022 A | 11/1983 | Suntola et al. |
| 4,414,492 A | 11/1983 | Hanlet |
| 4,436,674 A | 3/1984 | McMenamin |
| 4,444,990 A | 4/1984 | Villar |
| 4,454,370 A | 6/1984 | Voznick |
| 4,455,193 A | 6/1984 | Jeuch et al. |
| 4,465,716 A | 8/1984 | Baber et al. |
| 4,466,766 A | 8/1984 | Geren et al. |
| 4,479,831 A | 10/1984 | Sandow |
| 4,480,284 A | 10/1984 | Tojo et al. |
| 4,481,300 A | 11/1984 | Hartnett et al. |
| 4,484,061 A | 11/1984 | Zelinka et al. |
| 4,488,506 A | 12/1984 | Heinecke et al. |
| 4,495,024 A | 1/1985 | Bok |
| 4,496,828 A | 1/1985 | Kusmierz et al. |
| 4,499,354 A | 2/1985 | Hill et al. |
| 4,502,094 A | 2/1985 | Lewin et al. |
| 4,504,439 A | 3/1985 | Elter et al. |
| 4,512,113 A | 4/1985 | Budinger |
| 4,512,841 A | 4/1985 | Cunningham et al. |
| 4,520,116 A | 5/1985 | Gentilman et al. |
| 4,520,421 A | 5/1985 | Sakitani et al. |
| 4,527,005 A | 7/1985 | McKelvey et al. |
| 4,534,816 A | 8/1985 | Chen et al. |
| 4,535,628 A | 8/1985 | Hope |
| 4,537,001 A | 8/1985 | Uppstrom |
| 4,548,688 A | 10/1985 | Mathews |
| 4,551,192 A | 11/1985 | Di Milia et al. |
| 4,554,611 A | 11/1985 | Lewin |
| 4,560,590 A | 12/1985 | Bok |
| 4,570,328 A | 2/1986 | Price et al. |
| 4,575,408 A | 3/1986 | Bok |
| 4,575,636 A | 3/1986 | Caprari |
| 4,578,560 A | 3/1986 | Tanaka et al. |
| 4,579,080 A | 4/1986 | Martin et al. |
| 4,579,378 A | 4/1986 | Snyders |
| 4,579,623 A | 4/1986 | Suzuki et al. |
| 4,581,520 A | 4/1986 | Vu et al. |
| 4,590,326 A | 5/1986 | Woldy |
| 4,611,966 A | 9/1986 | Johnson |
| 4,620,998 A | 11/1986 | Lalvani |
| 4,622,918 A | 11/1986 | Bok |
| 4,624,728 A | 11/1986 | Bithell et al. |
| 4,653,541 A | 3/1987 | Oehlschlaeger et al. |
| 4,654,226 A | 3/1987 | Jackson et al. |
| 4,655,592 A | 4/1987 | Allemand |
| 4,662,987 A | 5/1987 | Bok |
| 4,664,769 A | 5/1987 | Cuomo et al. |
| 4,670,126 A | 6/1987 | Messer et al. |
| 4,681,134 A | 7/1987 | Paris |
| 4,693,211 A | 9/1987 | Ogami et al. |
| 4,700,089 A | 10/1987 | Fujii et al. |
| 4,707,815 A | 11/1987 | Yamasaki |
| 4,717,461 A | 1/1988 | Strahl et al. |
| 4,718,637 A | 1/1988 | Contin |
| 4,720,362 A | 1/1988 | Gentilman et al. |
| 4,720,407 A | 1/1988 | Sculke |
| 4,721,533 A | 1/1988 | Phillippi et al. |
| 4,721,534 A | 1/1988 | Phillippi et al. |
| 4,722,298 A | 2/1988 | Rubin et al. |
| 4,724,272 A | 2/1988 | Raniere et al. |
| 4,725,204 A | 2/1988 | Powell |
| 4,735,259 A | 4/1988 | Vincent |
| 4,738,618 A | 4/1988 | Massey et al. |
| 4,738,748 A | 4/1988 | Kisa |
| 4,747,367 A | 5/1988 | Posa |
| 4,749,416 A | 6/1988 | Greenspan |
| 4,750,520 A | 6/1988 | Heim et al. |
| 4,753,192 A | 6/1988 | Goldsmith et al. |
| 4,753,856 A | 6/1988 | Haluska et al. |

(56) References Cited

U.S. PATENT DOCUMENTS

| | | |
|---|---|---|
| 4,756,794 A | 7/1988 | Yoder |
| 4,764,076 A | 8/1988 | Layman et al. |
| 4,770,590 A | 9/1988 | Hugues et al. |
| 4,771,015 A | 9/1988 | Kanai |
| 4,775,281 A | 10/1988 | Prentakis |
| 4,776,744 A | 10/1988 | Stonestreet et al. |
| 4,780,169 A | 10/1988 | Stark et al. |
| 4,781,511 A | 11/1988 | Harada et al. |
| 4,789,294 A | 12/1988 | Sato et al. |
| 4,790,258 A | 12/1988 | Drage et al. |
| 4,802,441 A | 2/1989 | Waugh |
| 4,804,086 A | 2/1989 | Grohrock |
| 4,808,387 A | 2/1989 | Datta et al. |
| 4,812,201 A | 3/1989 | Sakai et al. |
| 4,812,217 A | 3/1989 | George et al. |
| 4,821,674 A | 4/1989 | deBoer et al. |
| 4,827,430 A | 5/1989 | Aid et al. |
| 4,828,224 A | 5/1989 | Crabb et al. |
| 4,830,515 A | 5/1989 | Cortes |
| 4,837,113 A | 6/1989 | Luttmer et al. |
| 4,837,185 A | 6/1989 | Yau et al. |
| 4,842,687 A | 6/1989 | Jucha |
| 4,849,067 A | 7/1989 | Jucha |
| 4,854,263 A | 8/1989 | Chang et al. |
| 4,854,266 A | 8/1989 | Simson et al. |
| 4,857,137 A | 8/1989 | Tachi et al. |
| 4,857,382 A | 8/1989 | Liu et al. |
| 4,858,557 A | 8/1989 | Pozzetti et al. |
| 4,863,374 A | 9/1989 | Vukovich |
| 4,863,558 A | 9/1989 | Jucha |
| 4,867,629 A | 9/1989 | Iwasawa et al. |
| 4,871,523 A | 10/1989 | Datta et al. |
| 4,874,273 A | 10/1989 | Tokisue et al. |
| 4,874,723 A | 10/1989 | Jucha |
| 4,880,982 A | 11/1989 | Hoksaas |
| 4,882,199 A | 11/1989 | Sadoway et al. |
| 4,886,162 A | 12/1989 | Ambrogio |
| 4,916,091 A | 4/1990 | Freeman et al. |
| 4,917,556 A | 4/1990 | Stark et al. |
| 4,920,918 A | 5/1990 | Adams et al. |
| 4,923,562 A | 5/1990 | Jucha |
| 4,925,388 A | 5/1990 | Iseki et al. |
| 4,931,135 A | 6/1990 | Horiuchi et al. |
| 4,934,831 A | 6/1990 | Volbrecht |
| 4,938,815 A | 7/1990 | McNeilly |
| 4,949,671 A | 8/1990 | Davis et al. |
| 4,949,848 A | 8/1990 | Kos |
| 4,950,624 A | 8/1990 | Inuzima et al. |
| 4,956,538 A | 9/1990 | Moslehi |
| 4,958,061 A | 9/1990 | Wakabayashi et al. |
| 4,962,063 A | 10/1990 | Maydan et al. |
| 4,963,506 A | 10/1990 | Liaw et al. |
| 4,976,996 A | 12/1990 | Monkowski et al. |
| 4,978,567 A | 12/1990 | Miller |
| 4,984,904 A | 1/1991 | Nakano et al. |
| 4,985,114 A | 1/1991 | Okudaira |
| 4,986,215 A | 1/1991 | Yamada |
| 4,987,102 A | 1/1991 | Nguyen et al. |
| 4,987,856 A | 1/1991 | Hey |
| 4,989,992 A | 2/1991 | Piai |
| 4,991,614 A | 2/1991 | Hammel |
| 5,002,632 A | 3/1991 | Loewenstein et al. |
| 5,013,691 A | 5/1991 | Lory et al. |
| 5,022,961 A | 6/1991 | Izumi et al. |
| 5,027,746 A | 7/1991 | Frijlink |
| 5,028,366 A | 7/1991 | Harakal et al. |
| 5,049,029 A | 9/1991 | Mitsui et al. |
| 5,053,247 A | 10/1991 | Moore |
| 5,057,436 A | 10/1991 | Ball |
| 5,060,322 A | 10/1991 | Delepine |
| 5,061,083 A | 10/1991 | Grimm et al. |
| 5,062,386 A | 11/1991 | Christensen |
| 5,064,337 A | 11/1991 | Asakawa et al. |
| 5,065,698 A | 11/1991 | Koike |
| 5,067,437 A | 11/1991 | Watanabe et al. |
| 5,069,591 A | 12/1991 | Kinoshita |
| 5,069,748 A * | 12/1991 | Przybysz .......... H01L 23/53285 427/63 |
| 5,071,258 A | 12/1991 | Usher et al. |
| 5,074,017 A | 12/1991 | Toya et al. |
| 5,082,517 A | 1/1992 | Moslehi |
| 5,084,126 A | 1/1992 | McKee |
| 5,088,444 A | 2/1992 | Ohmine et al. |
| 5,097,890 A | 3/1992 | Nakao |
| 5,098,638 A | 3/1992 | Sawada |
| 5,098,865 A | 3/1992 | Machado |
| 5,104,514 A | 4/1992 | Quartarone |
| 5,107,170 A | 4/1992 | Ishikawa et al. |
| 5,108,192 A | 4/1992 | Mailliet et al. |
| 5,110,407 A | 5/1992 | Ono et al. |
| 5,114,683 A | 5/1992 | Hirase |
| 5,116,018 A | 5/1992 | Friemoth et al. |
| 5,117,121 A | 5/1992 | Watanabe et al. |
| 5,119,760 A | 6/1992 | McMillan et al. |
| 5,124,272 A | 6/1992 | Saito et al. |
| 5,125,358 A | 6/1992 | Ueda et al. |
| 5,125,710 A | 6/1992 | Gianelo |
| 5,130,003 A | 7/1992 | Conrad |
| 5,134,965 A | 8/1992 | Tokuda et al. |
| 5,137,286 A | 8/1992 | Whitford |
| 5,151,296 A | 9/1992 | Tokunaga |
| 5,154,301 A | 10/1992 | Kos |
| 5,158,128 A | 10/1992 | Inoue et al. |
| 5,167,716 A | 12/1992 | Boitnott et al. |
| 5,167,761 A | 12/1992 | Westendorp et al. |
| 5,174,881 A | 12/1992 | Iwasaki et al. |
| 5,176,451 A | 1/1993 | Sasada |
| 5,178,639 A | 1/1993 | Nishi |
| 5,178,682 A | 1/1993 | Tsukamoto et al. |
| 5,180,273 A | 1/1993 | Sakaya et al. |
| 5,180,435 A | 1/1993 | Markunas et al. |
| 5,181,779 A | 1/1993 | Shia et al. |
| 5,182,232 A | 1/1993 | Chhabra et al. |
| 5,183,511 A | 2/1993 | Yamazaki et al. |
| 5,186,120 A | 2/1993 | Ohnishi et al. |
| 5,192,717 A | 3/1993 | Kawakami |
| 5,193,912 A | 3/1993 | Saunders |
| 5,193,969 A | 3/1993 | Rush et al. |
| 5,194,401 A | 3/1993 | Adams et al. |
| 5,199,603 A | 4/1993 | Prescott |
| 5,208,961 A | 5/1993 | Lajoie |
| 5,213,650 A | 5/1993 | Wang et al. |
| 5,219,226 A | 6/1993 | James |
| 5,221,556 A | 6/1993 | Hawkins et al. |
| 5,225,366 A | 7/1993 | Yoder |
| 5,226,383 A | 7/1993 | Bhat |
| 5,226,713 A | 7/1993 | Matsumura |
| 5,226,967 A | 7/1993 | Chen et al. |
| 5,228,114 A | 7/1993 | Suzuki |
| 5,231,062 A | 7/1993 | Mathers et al. |
| 5,232,508 A | 8/1993 | Arena et al. |
| 5,234,526 A | 8/1993 | Chen et al. |
| 5,242,501 A | 9/1993 | McDiarmid |
| 5,242,539 A | 9/1993 | Kumihashi et al. |
| 5,243,195 A | 9/1993 | Nishi |
| 5,243,202 A | 9/1993 | Mori et al. |
| 5,246,218 A | 9/1993 | Yap et al. |
| 5,246,500 A | 9/1993 | Samata et al. |
| 5,249,960 A | 10/1993 | Monoe |
| 5,250,092 A | 10/1993 | Nakano |
| 5,252,133 A | 10/1993 | Miyazaki et al. |
| 5,252,134 A | 10/1993 | Stauffer |
| 5,259,881 A | 11/1993 | Edwards et al. |
| 5,261,167 A | 11/1993 | Sakata |
| 5,266,526 A | 11/1993 | Aoyama |
| 5,268,989 A | 12/1993 | Moslehi et al. |
| 5,271,967 A | 12/1993 | Kramer et al. |
| 5,273,609 A | 12/1993 | Moslehi |
| 5,277,932 A | 1/1994 | Spencer |
| 5,278,494 A | 1/1994 | Obigane |
| 5,279,886 A | 1/1994 | Kawai et al. |
| 5,279,986 A | 1/1994 | Maloney et al. |
| 5,280,894 A | 1/1994 | Witcraft et al. |
| 5,281,274 A | 1/1994 | Yoder |

(56) References Cited

U.S. PATENT DOCUMENTS

| | | |
|---|---|---|
| 5,284,519 A | 2/1994 | Gadgil |
| 5,288,684 A | 2/1994 | Yamazaki et al. |
| 5,294,572 A | 3/1994 | Granneman et al. |
| 5,294,778 A | 3/1994 | Carman et al. |
| 5,295,777 A | 3/1994 | Hodos |
| 5,298,089 A | 3/1994 | Bowe et al. |
| 5,298,112 A * | 3/1994 | Hayasaka .......... G03F 7/427 216/48 |
| 5,305,417 A | 4/1994 | Najm et al. |
| 5,306,666 A | 4/1994 | Izumi |
| 5,306,946 A | 4/1994 | Yamamoto |
| 5,308,650 A | 5/1994 | Krummel et al. |
| 5,308,788 A | 5/1994 | Fitch et al. |
| 5,310,410 A | 5/1994 | Begin et al. |
| 5,310,456 A | 5/1994 | Kadomura |
| 5,312,245 A | 5/1994 | Brannen et al. |
| 5,313,061 A | 5/1994 | Drew et al. |
| 5,314,538 A | 5/1994 | Maeda et al. |
| 5,314,570 A | 5/1994 | Ikegaya et al. |
| 5,315,092 A | 5/1994 | Takahashi et al. |
| 5,320,218 A | 6/1994 | Yamashita et al. |
| 5,326,427 A | 7/1994 | Jerbic |
| 5,328,360 A | 7/1994 | Yokokawa |
| 5,328,810 A | 7/1994 | Lowrey et al. |
| 5,335,309 A | 8/1994 | Fujii et al. |
| 5,336,327 A | 8/1994 | Lee |
| 5,338,362 A | 8/1994 | Imahashi |
| 5,340,261 A | 8/1994 | Oosawa et al. |
| 5,346,961 A | 9/1994 | Shaw et al. |
| 5,348,774 A | 9/1994 | Golecki et al. |
| 5,350,480 A | 9/1994 | Gray |
| 5,354,433 A | 10/1994 | Granneman et al. |
| 5,354,580 A | 10/1994 | Goela et al. |
| 5,356,478 A | 10/1994 | Chen et al. |
| 5,356,672 A | 10/1994 | Schmitt et al. |
| 5,360,269 A | 11/1994 | Ogawa et al. |
| 5,362,328 A | 11/1994 | Gardiner et al. |
| 5,364,667 A | 11/1994 | Rhieu |
| 5,374,315 A | 12/1994 | Deboer et al. |
| 5,378,501 A | 1/1995 | Foster et al. |
| 5,380,367 A | 1/1995 | Bertone |
| 5,382,311 A | 1/1995 | Ishikawa et al. |
| 5,387,265 A | 2/1995 | Kakizaki et al. |
| 5,388,945 A | 2/1995 | Garric et al. |
| 5,393,577 A | 2/1995 | Uesugi et al. |
| 5,397,395 A | 3/1995 | Sano et al. |
| 5,403,630 A | 4/1995 | Matsui et al. |
| 5,404,082 A | 4/1995 | Hernandez et al. |
| 5,407,449 A | 4/1995 | Zinger |
| 5,407,867 A | 4/1995 | Iwasaki et al. |
| 5,413,813 A | 5/1995 | Cruse et al. |
| 5,414,221 A | 5/1995 | Gardner |
| 5,415,753 A | 5/1995 | Hurwitt et al. |
| 5,418,382 A | 5/1995 | Blackwood et al. |
| 5,421,893 A | 6/1995 | Perlov |
| 5,422,139 A | 6/1995 | Fischer |
| 5,423,942 A | 6/1995 | Robbins et al. |
| 5,426,137 A | 6/1995 | Allen |
| 5,427,824 A | 6/1995 | Inushima et al. |
| 5,430,011 A | 7/1995 | Tanaka et al. |
| 5,431,734 A | 7/1995 | Chapple-Sokol et al. |
| 5,443,646 A | 8/1995 | Yamada et al. |
| 5,443,648 A | 8/1995 | Ohkase |
| 5,443,686 A | 8/1995 | Jones et al. |
| 5,444,217 A | 8/1995 | Moore |
| 5,447,294 A | 9/1995 | Sakata et al. |
| 5,453,124 A | 9/1995 | Moslehi et al. |
| 5,456,207 A | 10/1995 | Gedridge et al. |
| 5,456,757 A | 10/1995 | Aruga et al. |
| 5,461,214 A | 10/1995 | Peck et al. |
| 5,462,899 A | 10/1995 | Ikeda |
| 5,463,176 A | 10/1995 | Eckert |
| 5,464,313 A | 11/1995 | Ohsawa |
| 5,474,410 A | 12/1995 | Ozawa et al. |
| 5,474,612 A | 12/1995 | Sato et al. |
| 5,478,429 A | 12/1995 | Komino et al. |
| 5,480,488 A | 1/1996 | Bittner et al. |
| 5,480,818 A | 1/1996 | Matsumoto et al. |
| 5,482,559 A | 1/1996 | Imai et al. |
| 5,484,484 A | 1/1996 | Yamaga et al. |
| 5,494,439 A | 2/1996 | Goldstein et al. |
| 5,494,494 A | 2/1996 | Mizuno et al. |
| 5,496,408 A | 3/1996 | Motoda et al. |
| 5,501,740 A | 3/1996 | Besen et al. |
| 5,503,875 A | 4/1996 | Imai et al. |
| 5,504,042 A | 4/1996 | Cho et al. |
| 5,510,277 A | 4/1996 | Cunningham et al. |
| 5,512,102 A | 4/1996 | Yamazaki |
| 5,514,439 A | 5/1996 | Sibley |
| 5,518,549 A | 5/1996 | Hellwig |
| 5,518,780 A | 5/1996 | Tamor et al. |
| 5,519,234 A | 5/1996 | Paz de Araujo |
| 5,520,743 A | 5/1996 | Takahashi et al. |
| 5,523,616 A | 6/1996 | Yasuhide |
| 5,527,111 A | 6/1996 | Lysen et al. |
| 5,527,417 A | 6/1996 | Iida et al. |
| 5,531,218 A | 7/1996 | Krebs |
| 5,531,835 A | 7/1996 | Fodor et al. |
| 5,537,311 A | 7/1996 | Stevens |
| 5,540,059 A | 7/1996 | Yokokawa |
| 5,540,821 A | 7/1996 | Tepman |
| 5,540,898 A | 7/1996 | Davidson |
| 5,554,557 A | 9/1996 | Koh |
| 5,556,275 A | 9/1996 | Sakata et al. |
| 5,558,717 A | 9/1996 | Zhao et al. |
| 5,559,046 A | 9/1996 | Oishi et al. |
| 5,562,383 A | 10/1996 | Iwai et al. |
| 5,562,947 A | 10/1996 | White et al. |
| 5,562,952 A | 10/1996 | Nakahigashi et al. |
| 5,565,038 A | 10/1996 | Ashley |
| 5,569,402 A | 10/1996 | Meisser et al. |
| 5,574,247 A | 11/1996 | Nishitani et al. |
| 5,576,629 A | 11/1996 | Turner |
| 5,577,331 A | 11/1996 | Suzuki |
| 5,583,736 A | 12/1996 | Anderson et al. |
| 5,584,936 A | 12/1996 | Pickering et al. |
| 5,584,963 A | 12/1996 | Takahashi |
| 5,586,585 A | 12/1996 | Bonora et al. |
| 5,589,002 A | 12/1996 | Su |
| 5,589,110 A | 12/1996 | Motoda et al. |
| 5,595,606 A | 1/1997 | Fujikawa et al. |
| 5,601,641 A | 2/1997 | Stephens |
| 5,602,060 A | 2/1997 | Kobayashi et al. |
| 5,604,410 A | 2/1997 | Vollkommer et al. |
| 5,611,448 A | 3/1997 | Chen |
| 5,616,264 A | 4/1997 | Nishi et al. |
| 5,616,947 A | 4/1997 | Tamura |
| 5,621,982 A | 4/1997 | Yamashita |
| 5,632,919 A | 5/1997 | MacCracken et al. |
| 5,637,153 A | 6/1997 | Niino et al. |
| 5,645,646 A | 7/1997 | Beinglass et al. |
| 5,650,013 A | 7/1997 | Yamazaki |
| 5,650,351 A | 7/1997 | Wu |
| 5,653,807 A | 8/1997 | Crumbaker |
| 5,656,093 A | 8/1997 | Burkhart et al. |
| 5,661,263 A | 8/1997 | Salvaggio |
| 5,662,470 A | 9/1997 | Huussen et al. |
| 5,663,899 A | 9/1997 | Zvonar et al. |
| 5,665,608 A | 9/1997 | Chapple-Sokol et al. |
| 5,667,592 A | 9/1997 | Boitnott et al. |
| 5,670,786 A | 9/1997 | Meyer et al. |
| 5,679,215 A | 10/1997 | Barnes et al. |
| 5,681,779 A | 10/1997 | Pasch et al. |
| 5,683,517 A | 11/1997 | Shan |
| 5,683,561 A | 11/1997 | Hollars et al. |
| 5,685,912 A | 11/1997 | Nishizaka |
| 5,685,914 A | 11/1997 | Hills et al. |
| 5,690,742 A | 11/1997 | Ogata et al. |
| 5,695,567 A | 12/1997 | Kordina |
| 5,697,706 A | 12/1997 | Ciaravino et al. |
| 5,698,036 A | 12/1997 | Ishii et al. |
| 5,700,729 A | 12/1997 | Lee et al. |
| 5,708,825 A | 1/1998 | Sotomayor |
| 5,709,745 A | 1/1998 | Larkin et al. |

(56) References Cited

U.S. PATENT DOCUMENTS

| | | |
|---|---|---|
| 5,711,811 A | 1/1998 | Suntola et al. |
| 5,716,133 A | 2/1998 | Hosokawa et al. |
| 5,718,574 A | 2/1998 | Shimazu |
| 5,720,927 A | 2/1998 | Cripe et al. |
| 5,724,748 A | 3/1998 | Brooks |
| 5,728,223 A | 3/1998 | Murakarni et al. |
| 5,728,425 A | 3/1998 | Ebe et al. |
| 5,730,801 A | 3/1998 | Tepman et al. |
| 5,730,802 A | 3/1998 | Ishizumi et al. |
| 5,732,597 A | 3/1998 | Devenyi |
| 5,732,744 A | 3/1998 | Barr et al. |
| 5,732,957 A | 3/1998 | Yu |
| 5,736,314 A | 4/1998 | Hayes et al. |
| 5,753,835 A | 5/1998 | Gustin |
| 5,754,390 A | 5/1998 | Sandhu et al. |
| 5,759,281 A | 6/1998 | Gurary et al. |
| 5,761,328 A | 6/1998 | Solberg et al. |
| 5,766,365 A | 6/1998 | Umutoy et al. |
| 5,768,125 A | 6/1998 | Zinger et al. |
| 5,769,952 A | 6/1998 | Komino |
| 5,775,889 A | 7/1998 | Kobayashi et al. |
| 5,777,838 A | 7/1998 | Tamagawa et al. |
| 5,779,203 A | 7/1998 | Edlinger |
| 5,781,693 A | 7/1998 | Ballance et al. |
| 5,782,979 A | 7/1998 | Kaneno |
| 5,788,778 A | 8/1998 | Shang |
| 5,790,750 A | 8/1998 | Anderson |
| 5,791,782 A | 8/1998 | Wooten et al. |
| 5,792,272 A | 8/1998 | van Os et al. |
| 5,796,074 A | 8/1998 | Edelstein et al. |
| 5,801,104 A | 9/1998 | Schuegraf et al. |
| 5,801,945 A | 9/1998 | Comer |
| 5,804,505 A | 9/1998 | Yamada et al. |
| 5,806,980 A | 9/1998 | Berrian |
| 5,813,851 A | 9/1998 | Nakao |
| 5,818,716 A | 10/1998 | Chin et al. |
| 5,819,092 A | 10/1998 | Ferguson et al. |
| 5,819,434 A | 10/1998 | Herchen et al. |
| 5,820,366 A | 10/1998 | Lee |
| 5,820,685 A | 10/1998 | Kurihra et al. |
| 5,820,686 A | 10/1998 | Moore |
| 5,826,129 A | 10/1998 | Hasebe et al. |
| 5,827,420 A | 10/1998 | Shirazi et al. |
| 5,827,435 A | 10/1998 | Samukawa |
| 5,827,757 A | 10/1998 | Robinson et al. |
| 5,836,483 A | 11/1998 | Disel |
| 5,837,058 A | 11/1998 | Chen et al. |
| 5,837,320 A | 11/1998 | Hampden-Smith et al. |
| 5,844,683 A | 12/1998 | Pavloski et al. |
| 5,846,332 A | 12/1998 | Zhao et al. |
| 5,851,293 A | 12/1998 | Lane et al. |
| 5,851,294 A | 12/1998 | Young et al. |
| 5,851,299 A | 12/1998 | Cheng et al. |
| 5,852,445 A | 12/1998 | Yoshikawa et al. |
| 5,852,879 A | 12/1998 | Schumaier |
| 5,853,484 A | 12/1998 | Jeong |
| 5,855,680 A | 1/1999 | Soininen et al. |
| 5,855,681 A | 1/1999 | Maydan et al. |
| 5,855,687 A | 1/1999 | DuBois et al. |
| 5,855,726 A | 1/1999 | Soraoka et al. |
| 5,857,777 A | 1/1999 | Schuh |
| 5,861,233 A | 1/1999 | Sekine et al. |
| 5,862,302 A | 1/1999 | Okase |
| 5,863,123 A | 1/1999 | Lee et al. |
| 5,865,205 A | 2/1999 | Wilmer |
| 5,866,795 A | 2/1999 | Wang et al. |
| 5,871,586 A | 2/1999 | Crawley et al. |
| 5,872,065 A | 2/1999 | Sivaramakrishnan |
| 5,873,942 A | 2/1999 | Park |
| 5,877,095 A | 3/1999 | Tamura et al. |
| 5,879,128 A | 3/1999 | Tietz et al. |
| 5,879,459 A | 3/1999 | Gadgil et al. |
| 5,880,980 A | 3/1999 | Rothacher et al. |
| 5,882,165 A | 3/1999 | Maydan et al. |
| 5,884,640 A | 3/1999 | Fishkin et al. |
| 5,888,304 A | 3/1999 | Umotoy et al. |
| 5,891,251 A | 4/1999 | MacLeish et al. |
| 5,893,741 A | 4/1999 | Huang |
| 5,897,348 A | 4/1999 | Wu |
| 5,897,378 A | 4/1999 | Eriguchi |
| 5,897,379 A | 4/1999 | Ulrich et al. |
| 5,897,710 A | 4/1999 | Sato et al. |
| 5,904,170 A | 5/1999 | Harvey et al. |
| 5,908,672 A | 6/1999 | Ryu |
| 5,915,200 A | 6/1999 | Tokumasu et al. |
| 5,915,562 A | 6/1999 | Nyseth et al. |
| 5,916,365 A | 6/1999 | Sherman |
| 5,920,798 A | 7/1999 | Higuchi et al. |
| 5,928,426 A | 7/1999 | Aitchison |
| 5,937,142 A | 8/1999 | Moslehi et al. |
| 5,937,323 A | 8/1999 | Orczyk et al. |
| 5,939,886 A | 8/1999 | Turner et al. |
| 5,947,718 A | 9/1999 | Weaver |
| 5,950,327 A | 9/1999 | Peterson et al. |
| 5,950,925 A | 9/1999 | Fukunaga et al. |
| 5,954,375 A | 9/1999 | Trickle et al. |
| 5,961,775 A | 10/1999 | Fujimura |
| 5,968,275 A | 10/1999 | Lee et al. |
| 5,970,621 A | 10/1999 | Bazydola |
| 5,972,196 A | 10/1999 | Murphy et al. |
| 5,975,492 A | 11/1999 | Brenes |
| 5,976,973 A | 11/1999 | Ohira et al. |
| 5,979,506 A | 11/1999 | Aarseth |
| 5,982,931 A | 11/1999 | Ishimaru |
| 5,984,391 A | 11/1999 | Vanderpot et al. |
| 5,987,480 A | 11/1999 | Donohue et al. |
| 5,989,342 A | 11/1999 | Ikeda et al. |
| 5,992,453 A | 11/1999 | Zimmer |
| 5,997,588 A | 12/1999 | Goodwin |
| 5,997,768 A | 12/1999 | Scully |
| 5,998,870 A | 12/1999 | Lee et al. |
| 6,000,732 A | 12/1999 | Scheler et al. |
| 6,001,183 A | 12/1999 | Gurary et al. |
| 6,001,267 A | 12/1999 | Van Os et al. |
| 6,004,204 A | 12/1999 | Luxton et al. |
| 6,013,553 A | 1/2000 | Wallace |
| 6,013,920 A | 1/2000 | Gordon et al. |
| 6,014,677 A | 1/2000 | Hayashi et al. |
| 6,015,459 A | 1/2000 | Jamison et al. |
| 6,015,465 A | 1/2000 | Kholodenko et al. |
| 6,017,779 A | 1/2000 | Miyasaka |
| 6,017,818 A | 1/2000 | Lu |
| 6,022,180 A | 2/2000 | Motoyama et al. |
| 6,022,802 A | 2/2000 | Jang |
| 6,024,799 A | 2/2000 | Chen et al. |
| 6,025,117 A | 2/2000 | Nakano et al. |
| 6,027,163 A | 2/2000 | Longenecker et al. |
| 6,029,602 A | 2/2000 | Bhatnagar |
| 6,030,900 A | 2/2000 | Grass1 et al. |
| 6,033,215 A | 3/2000 | Ohsawa |
| 6,035,101 A | 3/2000 | Sajoto et al. |
| 6,035,804 A | 3/2000 | Arami et al. |
| 6,039,809 A | 3/2000 | Toyama et al. |
| 6,042,652 A | 3/2000 | Hyun |
| 6,044,860 A | 4/2000 | Neu |
| 6,045,260 A | 4/2000 | Schwartz et al. |
| 6,048,154 A | 4/2000 | Wytman |
| 6,050,506 A | 4/2000 | Guo et al. |
| 6,053,982 A | 4/2000 | Halpin et al. |
| 6,053,983 A | 4/2000 | Saeki et al. |
| 6,054,013 A | 4/2000 | Collins et al. |
| 6,054,678 A | 4/2000 | Miyazaki |
| 6,060,691 A | 5/2000 | Minami et al. |
| 6,060,721 A | 5/2000 | Huang |
| 6,063,196 A | 5/2000 | Li et al. |
| 6,066,204 A | 5/2000 | Haven |
| 6,068,441 A | 5/2000 | Raaijmakers et al. |
| 6,070,599 A | 6/2000 | Ghanayem |
| 6,071,572 A | 6/2000 | Mosely et al. |
| 6,072,163 A | 6/2000 | Armstrong et al. |
| 6,073,973 A | 6/2000 | Boscaljon et al. |
| 6,074,154 A | 6/2000 | Ueda et al. |
| 6,074,443 A | 6/2000 | Venkatesh |
| 6,074,514 A | 6/2000 | Bjorkman et al. |

(56) References Cited

U.S. PATENT DOCUMENTS

| | | |
|---|---|---|
| 6,077,027 A | 6/2000 | Kawamura et al. |
| 6,079,356 A | 6/2000 | Umotoy et al. |
| 6,079,927 A | 6/2000 | Muka |
| 6,083,321 A | 7/2000 | Lei et al. |
| 6,086,677 A | 7/2000 | Umotoy et al. |
| 6,090,212 A | 7/2000 | Mahawili |
| 6,090,442 A | 7/2000 | Klaus et al. |
| 6,090,659 A | 7/2000 | Laibowitz et al. |
| 6,091,062 A | 7/2000 | Pfahnl et al. |
| 6,093,252 A | 7/2000 | Wengert et al. |
| 6,093,253 A | 7/2000 | Lofgren |
| 6,093,611 A | 7/2000 | Gardner et al. |
| 6,095,083 A | 8/2000 | Rice et al. |
| 6,096,133 A | 8/2000 | Yuuki et al. |
| 6,096,267 A | 8/2000 | Kishkovich |
| 6,099,302 A | 8/2000 | Hong et al. |
| 6,099,649 A | 8/2000 | Schmitt et al. |
| 6,099,651 A | 8/2000 | Sajoto et al. |
| 6,102,565 A | 8/2000 | Kita et al. |
| 6,104,002 A | 8/2000 | Hirose et al. |
| 6,104,011 A | 8/2000 | Juliano |
| 6,104,401 A | 8/2000 | Parsons |
| 6,106,625 A | 8/2000 | Koai et al. |
| 6,106,678 A | 8/2000 | Shufflebotham |
| 6,110,531 A | 8/2000 | Paz de Araujo et al. |
| 6,113,703 A | 9/2000 | Anderson et al. |
| 6,119,710 A | 9/2000 | Brown |
| 6,121,061 A | 9/2000 | Van Bilsen et al. |
| 6,121,158 A | 9/2000 | Benchikha et al. |
| 6,122,036 A | 9/2000 | Yamasaki et al. |
| 6,124,600 A | 9/2000 | Moroishi et al. |
| 6,125,789 A | 10/2000 | Gupta et al. |
| 6,125,859 A | 10/2000 | Kao |
| 6,126,744 A | 10/2000 | Hawkins et al. |
| 6,126,848 A | 10/2000 | Li et al. |
| 6,127,249 A | 10/2000 | Hu |
| 6,129,044 A | 10/2000 | Zhao et al. |
| 6,129,546 A | 10/2000 | Sada |
| 6,132,207 A | 10/2000 | Stoutjesdijk |
| 6,134,807 A | 10/2000 | Komino |
| 6,135,460 A | 10/2000 | Wise et al. |
| 6,137,240 A | 10/2000 | Bogdan |
| 6,139,239 A | 10/2000 | Snijders |
| 6,139,983 A | 10/2000 | Ohashi et al. |
| 6,140,252 A | 10/2000 | Cho et al. |
| 6,143,079 A | 11/2000 | Halpin |
| 6,143,082 A | 11/2000 | McInerney et al. |
| 6,143,129 A | 11/2000 | Savas et al. |
| 6,146,463 A | 11/2000 | Yudovsky et al. |
| 6,148,761 A | 11/2000 | Majewski et al. |
| 6,151,446 A | 11/2000 | Hunter et al. |
| 6,152,070 A | 11/2000 | Fairbairn et al. |
| 6,152,669 A | 11/2000 | Morita et al. |
| 6,156,151 A | 12/2000 | Komino et al. |
| 6,158,941 A | 12/2000 | Muka et al. |
| 6,159,301 A | 12/2000 | Sato et al. |
| 6,160,244 A | 12/2000 | Ohashi |
| 6,161,500 A | 12/2000 | Kopacz et al. |
| 6,162,323 A | 12/2000 | Koshimizu |
| 6,164,894 A | 12/2000 | Cheng |
| 6,174,809 B1 | 1/2001 | Kang et al. |
| 6,176,929 B1 | 1/2001 | Fukunaga et al. |
| 6,177,688 B1 | 1/2001 | Linthicum et al. |
| 6,178,918 B1 | 1/2001 | Van Os et al. |
| 6,179,955 B1 | 1/2001 | Shin et al. |
| 6,180,979 B1 | 1/2001 | Hofman et al. |
| 6,182,603 B1 | 2/2001 | Shang et al. |
| 6,183,564 B1 | 2/2001 | Reynolds et al. |
| 6,183,565 B1 | 2/2001 | Granneman et al. |
| 6,187,672 B1 | 2/2001 | Zhao et al. |
| 6,187,691 B1 | 2/2001 | Fukuda |
| 6,189,482 B1 | 2/2001 | Zhao et al. |
| 6,190,037 B1 | 2/2001 | Das et al. |
| 6,190,113 B1 | 2/2001 | Bui et al. |
| 6,190,634 B1 | 2/2001 | Lieber et al. |
| 6,191,399 B1 | 2/2001 | Van Bilsen |
| 6,194,037 B1 | 2/2001 | Terasaki et al. |
| 6,200,897 B1 | 3/2001 | Wang et al. |
| 6,201,999 B1 | 3/2001 | Jevtic |
| 6,203,613 B1 | 3/2001 | Gates et al. |
| 6,203,618 B1 | 3/2001 | Hashizume et al. |
| 6,207,932 B1 | 3/2001 | Yoo |
| 6,207,936 B1 | 3/2001 | de Waard |
| 6,209,221 B1 | 4/2001 | Beulens |
| 6,210,485 B1 | 4/2001 | Zhao et al. |
| 6,212,789 B1 | 4/2001 | Kato |
| 6,213,708 B1 | 4/2001 | Allen |
| 6,214,122 B1 | 4/2001 | Thompson |
| 6,214,717 B1 | 4/2001 | Yan et al. |
| 6,217,658 B1 | 4/2001 | Orczyk et al. |
| 6,217,662 B1 | 4/2001 | Kong et al. |
| 6,218,288 B1 | 4/2001 | Li et al. |
| 6,224,679 B1 | 5/2001 | Sasaki et al. |
| 6,225,020 B1 | 5/2001 | Jung et al. |
| 6,225,602 B1 | 5/2001 | Buijze et al. |
| 6,225,745 B1 | 5/2001 | Srivastava |
| 6,230,650 B1 | 5/2001 | Yamazaki |
| 6,231,290 B1 | 5/2001 | Kikuchi et al. |
| 6,235,121 B1 | 5/2001 | Honma et al. |
| 6,235,858 B1 | 5/2001 | Swarup et al. |
| 6,238,734 B1 | 5/2001 | Senzaki et al. |
| 6,239,402 B1 | 5/2001 | Araki et al. |
| 6,239,715 B1 | 5/2001 | Belton |
| 6,240,875 B1 | 6/2001 | Wijck et al. |
| 6,241,822 B1 | 6/2001 | Ide |
| 6,242,359 B1 | 6/2001 | Misra |
| 6,243,654 B1 | 6/2001 | Johnson et al. |
| 6,245,647 B1 | 6/2001 | Akiyama et al. |
| 6,245,665 B1 | 6/2001 | Yokoyama |
| 6,247,245 B1 | 6/2001 | Ishii |
| 6,250,250 B1 | 6/2001 | Maishev et al. |
| 6,255,221 B1 | 7/2001 | Hudson et al. |
| 6,257,758 B1 | 7/2001 | Culbertson |
| 6,261,648 B1 | 7/2001 | Akiba et al. |
| 6,264,467 B1 | 7/2001 | Lue et al. |
| 6,265,113 B1 | 7/2001 | Rosasco et al. |
| 6,265,311 B1 | 7/2001 | Hautala et al. |
| 6,270,572 B1 | 8/2001 | Kim et al. |
| 6,271,148 B1 | 8/2001 | Kao |
| 6,271,320 B1 | 8/2001 | Keller et al. |
| 6,274,058 B1 | 8/2001 | Rajagopalan |
| 6,274,496 B1 | 8/2001 | Leusink et al. |
| 6,274,878 B1 | 8/2001 | Li et al. |
| 6,281,098 B1 | 8/2001 | Wang |
| 6,281,141 B1 | 8/2001 | Das et al. |
| 6,283,692 B1 | 9/2001 | Perlov et al. |
| 6,284,050 B1 | 9/2001 | Shi et al. |
| 6,284,149 B1 | 9/2001 | Li et al. |
| 6,287,965 B1 | 9/2001 | Kang et al. |
| 6,287,988 B1 | 9/2001 | Nagamine et al. |
| 6,293,700 B1 | 9/2001 | Lund et al. |
| 6,296,710 B1 | 10/2001 | Allen et al. |
| 6,296,711 B1 | 10/2001 | Loan et al. |
| 6,296,909 B1 | 10/2001 | Spitsberg |
| 6,297,539 B1 | 10/2001 | Ma et al. |
| 6,299,133 B2 | 10/2001 | Waragai et al. |
| 6,302,964 B1 | 10/2001 | Umotoy et al. |
| 6,303,523 B2 | 10/2001 | Cheung |
| 6,305,898 B1 | 10/2001 | Yamagishi et al. |
| 6,311,016 B1 | 10/2001 | Yanagawa et al. |
| 6,312,525 B1 | 11/2001 | Bright et al. |
| 6,315,512 B1 | 11/2001 | Tabrizi et al. |
| 6,316,162 B1 | 11/2001 | Jung et al. |
| 6,316,371 B1 | 11/2001 | Oosterlaken et al. |
| 6,320,320 B1 | 11/2001 | Bailey et al. |
| 6,321,680 B2 | 11/2001 | Cook et al. |
| 6,321,780 B1 | 11/2001 | Iwabuchi |
| 6,325,858 B1 | 12/2001 | Wengert |
| 6,326,322 B1 | 12/2001 | Kim et al. |
| 6,326,597 B1 | 12/2001 | Lubomirsky et al. |
| 6,328,561 B1 | 12/2001 | Hasper et al. |
| 6,328,864 B1 | 12/2001 | Ishizawa et al. |
| 6,329,297 B1 | 12/2001 | Balish |
| 6,333,275 B1 | 12/2001 | Mayer et al. |

(56) References Cited

U.S. PATENT DOCUMENTS

| | | |
|---|---|---|
| 6,335,049 B1 | 1/2002 | Basceri |
| 6,335,240 B1 | 1/2002 | Kim et al. |
| 6,335,293 B1 | 1/2002 | Luo et al. |
| 6,342,427 B1 | 1/2002 | Choi et al. |
| 6,343,239 B1 | 1/2002 | Toda et al. |
| 6,344,084 B1 | 2/2002 | Koinuma et al. |
| 6,344,232 B1 | 2/2002 | Jones et al. |
| 6,346,419 B1 | 2/2002 | Ryerson et al. |
| 6,347,636 B1 | 2/2002 | Xia |
| 6,350,391 B1 | 2/2002 | Livshits et al. |
| 6,352,049 B1 | 3/2002 | Yin et al. |
| 6,352,945 B1 | 3/2002 | Matsuki |
| 6,357,984 B1 | 3/2002 | Zinger et al. |
| 6,363,294 B1 | 3/2002 | Coronel et al. |
| 6,367,410 B1 | 4/2002 | Leahey et al. |
| 6,368,773 B1 | 4/2002 | Jung et al. |
| 6,368,987 B1 | 4/2002 | Kopacz et al. |
| 6,370,796 B1 | 4/2002 | Zucker |
| 6,372,583 B1 | 4/2002 | Tyagi |
| 6,374,831 B1 | 4/2002 | Chandran |
| 6,375,312 B1 | 4/2002 | Ikeda et al. |
| 6,375,749 B1 | 4/2002 | Boydston et al. |
| 6,375,750 B1 | 4/2002 | Van Os et al. |
| 6,379,466 B1 | 4/2002 | Sahin et al. |
| 6,383,300 B1 | 5/2002 | Saito et al. |
| 6,383,566 B1 | 5/2002 | Zagdoun |
| 6,383,955 B1 | 5/2002 | Matsuki |
| 6,387,207 B1 | 5/2002 | Janakiraman |
| 6,387,823 B1 | 5/2002 | Sonderman et al. |
| 6,387,827 B1 | 5/2002 | Mertens et al. |
| 6,390,753 B1 | 5/2002 | de Ridder et al. |
| 6,390,754 B2 | 5/2002 | Yamaga et al. |
| 6,391,803 B1 | 5/2002 | Kim et al. |
| 6,395,650 B1 | 5/2002 | Callegari et al. |
| 6,398,184 B1 | 6/2002 | Sowada et al. |
| 6,399,022 B1 | 6/2002 | Schuler et al. |
| 6,402,806 B1 | 6/2002 | Schmitt et al. |
| 6,410,433 B1 | 6/2002 | Hautala et al. |
| 6,410,459 B2 | 6/2002 | Blalock et al. |
| 6,410,463 B1 | 6/2002 | Matsuki |
| 6,413,321 B1 | 7/2002 | Kim et al. |
| 6,413,583 B1 | 7/2002 | Moghadam et al. |
| 6,420,279 B1 | 7/2002 | Ono et al. |
| 6,423,949 B1 | 7/2002 | Chen et al. |
| 6,428,859 B1 | 8/2002 | Chiang et al. |
| 6,429,465 B1 | 8/2002 | Yagi et al. |
| 6,432,206 B1 | 8/2002 | Tolt |
| 6,432,255 B1 | 8/2002 | Sun et al. |
| 6,432,479 B2 | 8/2002 | Chang et al. |
| 6,432,849 B1 | 8/2002 | Endo et al. |
| 6,433,298 B1 | 8/2002 | Ishii |
| 6,435,798 B1 | 8/2002 | Satoh |
| 6,435,865 B1 | 8/2002 | Tseng et al. |
| 6,436,819 B1 | 8/2002 | Zhang |
| 6,437,444 B2 | 8/2002 | Andideh |
| 6,438,502 B1 | 8/2002 | Awtrey |
| 6,439,822 B1 | 8/2002 | Kimura et al. |
| 6,440,261 B1 | 8/2002 | Tepman et al. |
| 6,441,350 B1 | 8/2002 | Stoddard et al. |
| 6,445,574 B1 | 9/2002 | Saw et al. |
| 6,446,573 B2 | 9/2002 | Hirayama et al. |
| 6,447,232 B1 | 9/2002 | Davis et al. |
| 6,447,651 B1 | 9/2002 | Ishikawa et al. |
| 6,447,937 B1 | 9/2002 | Murakawa et al. |
| 6,448,192 B1 | 9/2002 | Kaushik |
| 6,450,117 B1 | 9/2002 | Murugesh et al. |
| 6,450,757 B1 | 9/2002 | Saeki |
| 6,451,713 B1 | 9/2002 | Tay et al. |
| 6,452,017 B1 | 9/2002 | Uhlenbrock et al. |
| 6,454,860 B2 | 9/2002 | Metzner et al. |
| 6,454,909 B1 | 9/2002 | Matsuse et al. |
| 6,455,098 B2 | 9/2002 | Tran et al. |
| 6,455,225 B1 | 9/2002 | Kong et al. |
| 6,455,445 B2 | 9/2002 | Matsuki |
| 6,460,482 B1 | 10/2002 | Kuibira et al. |
| 6,461,435 B1 | 10/2002 | Littau et al. |
| 6,461,436 B1 | 10/2002 | Campbell et al. |
| 6,461,439 B1 | 10/2002 | Granneman et al. |
| 6,462,310 B1 | 10/2002 | Ratliff et al. |
| 6,464,825 B1 | 10/2002 | Shinozaki |
| 6,468,924 B2 | 10/2002 | Lee |
| 6,471,779 B1 | 10/2002 | Nishio et al. |
| 6,472,266 B1 | 10/2002 | Yu et al. |
| 6,474,987 B1 | 11/2002 | Huang et al. |
| 6,475,276 B1 | 11/2002 | Elers et al. |
| 6,475,902 B1 | 11/2002 | Hausmann et al. |
| 6,475,930 B1 | 11/2002 | Junker et al. |
| 6,478,872 B1 | 11/2002 | Chae et al. |
| 6,481,945 B1 | 11/2002 | Hasper et al. |
| 6,482,331 B2 | 11/2002 | Lu et al. |
| 6,482,663 B1 | 11/2002 | Buckland |
| 6,483,989 B1 | 11/2002 | Okada et al. |
| 6,488,774 B1 | 12/2002 | Horie et al. |
| 6,490,493 B1 | 12/2002 | Dharnipragada |
| 6,492,625 B1 | 12/2002 | Boguslavskiy et al. |
| 6,494,065 B2 | 12/2002 | Babbitt |
| 6,494,998 B1 | 12/2002 | Brcka |
| 6,496,819 B1 | 12/2002 | Bello et al. |
| 6,497,734 B1 | 12/2002 | Barber et al. |
| 6,497,767 B1 | 12/2002 | Okase et al. |
| 6,498,091 B1 | 12/2002 | Chen et al. |
| 6,499,533 B2 | 12/2002 | Yamada |
| 6,500,487 B1 | 12/2002 | Holst et al. |
| 6,502,530 B1 | 1/2003 | Turlot et al. |
| 6,503,079 B2 | 1/2003 | Kogano et al. |
| 6,503,330 B1 | 1/2003 | Sneh et al. |
| 6,503,365 B1 | 1/2003 | Kim et al. |
| 6,503,562 B1 | 1/2003 | Saito et al. |
| 6,503,826 B1 | 1/2003 | Oda |
| 6,506,009 B1 | 1/2003 | Nulman et al. |
| 6,506,253 B2 | 1/2003 | Sakuma |
| 6,507,410 B1 | 1/2003 | Robertson et al. |
| 6,511,539 B1 | 1/2003 | Raaijmakers |
| 6,514,313 B1 | 2/2003 | Spiegelman |
| 6,514,666 B1 | 2/2003 | Choi et al. |
| 6,521,295 B1 | 2/2003 | Remington |
| 6,521,547 B1 | 2/2003 | Chang et al. |
| 6,527,884 B1 | 3/2003 | Takakuwa et al. |
| 6,528,171 B1 | 3/2003 | Endler et al. |
| 6,528,430 B2 | 3/2003 | Kwan |
| 6,528,752 B1 | 3/2003 | Ishii et al. |
| 6,528,767 B2 | 3/2003 | Bagley et al. |
| 6,530,994 B1 | 3/2003 | Mahawili |
| 6,531,193 B2 | 3/2003 | Fonash et al. |
| 6,531,412 B2 | 3/2003 | Conti et al. |
| 6,534,133 B1 | 3/2003 | Kaloyeros et al. |
| 6,534,395 B2 | 3/2003 | Werkhoven et al. |
| 6,536,950 B1 | 3/2003 | Green |
| 6,539,891 B1 | 4/2003 | Kang et al. |
| 6,540,469 B2 | 4/2003 | Matsunaga et al. |
| 6,540,838 B2 | 4/2003 | Sneh et al. |
| 6,544,906 B2 | 4/2003 | Rotondaro et al. |
| 6,552,209 B1 | 4/2003 | Lei et al. |
| 6,558,517 B2 | 5/2003 | Basceri |
| 6,558,755 B2 | 5/2003 | Berry et al. |
| 6,559,026 B1 | 5/2003 | Rossman et al. |
| 6,562,094 B1 | 5/2003 | Denker et al. |
| 6,565,763 B1 | 5/2003 | Asakawa et al. |
| 6,566,278 B1 | 5/2003 | Harvey et al. |
| 6,569,239 B2 | 5/2003 | Arai et al. |
| 6,569,257 B1 | 5/2003 | Nguyen |
| 6,569,971 B2 | 5/2003 | Roh et al. |
| 6,573,030 B1 | 6/2003 | Fairbairn et al. |
| 6,574,644 B2 | 6/2003 | Hsu et al. |
| 6,576,062 B2 | 6/2003 | Matsuse |
| 6,576,064 B2 | 6/2003 | Griffiths et al. |
| 6,576,300 B1 | 6/2003 | Berry et al. |
| 6,576,564 B2 | 6/2003 | Agarwal |
| 6,578,589 B1 | 6/2003 | Mayusumi |
| 6,579,833 B1 | 6/2003 | McNallan et al. |
| 6,580,050 B1 | 6/2003 | Miller et al. |
| 6,581,612 B1 | 6/2003 | Loewenhardt |
| 6,582,174 B1 | 6/2003 | Hayashi |
| 6,583,048 B2 | 6/2003 | Vincent et al. |

(56) References Cited

U.S. PATENT DOCUMENTS

| | | |
|---|---|---|
| 6,596,398 B1 | 7/2003 | Russo et al. |
| 6,623,799 B1 | 9/2003 | Lee et al. |
| 6,658,933 B2 | 12/2003 | Allegre et al. |
| 6,659,111 B1 | 12/2003 | Mouri et al. |
| 6,676,759 B1 | 1/2004 | Takagi |
| 6,692,903 B2 | 2/2004 | Chen et al. |
| 6,712,949 B2 | 3/2004 | Gopal |
| 6,716,477 B1 | 4/2004 | Komiyama et al. |
| 6,720,262 B2 | 4/2004 | Koh et al. |
| 6,749,687 B1 | 6/2004 | Ferro |
| 6,766,545 B2 | 7/2004 | Hodges |
| 6,767,836 B2 | 7/2004 | San |
| 6,776,849 B2 | 8/2004 | Aggarwal et al. |
| 6,811,615 B2 | 11/2004 | Sun |
| 6,818,566 B2 | 11/2004 | Leeson et al. |
| 6,821,889 B2 | 11/2004 | Elers et al. |
| 6,825,106 B1 | 11/2004 | Gao et al. |
| 6,843,858 B2 | 1/2005 | Rossman |
| 6,854,580 B2 | 2/2005 | Braford |
| 6,867,086 B1 | 3/2005 | Chen et al. |
| 6,867,153 B2 | 3/2005 | Tokunaga |
| 6,868,856 B2 | 3/2005 | Nowak |
| 6,872,323 B1 | 3/2005 | Entley |
| 6,902,647 B2 | 6/2005 | Hasper |
| RE38,937 E | 1/2006 | Nakamura |
| 6,981,508 B2 | 1/2006 | Shang |
| D524,600 S | 7/2006 | Austin et al. |
| D525,127 S | 7/2006 | Cogley et al. |
| 7,122,844 B2 | 10/2006 | Nakamura et al. |
| 7,144,806 B1 | 12/2006 | Fair et al. |
| D535,673 S | 1/2007 | Conway et al. |
| 7,229,502 B2 | 6/2007 | Wang et al. |
| 7,234,476 B2 | 6/2007 | Arai |
| D549,815 S | 8/2007 | Murphy |
| 7,297,641 B2 | 11/2007 | Todd et al. |
| 7,311,977 B2 | 12/2007 | Yokota et al. |
| D562,357 S | 2/2008 | Hardy |
| 7,371,668 B2 | 5/2008 | Lee |
| 7,410,666 B2 | 8/2008 | Elers |
| 7,581,549 B2 | 9/2009 | Johnson |
| 7,662,689 B2 | 2/2010 | Boyanov et al. |
| D614,258 S | 4/2010 | Kojima |
| 7,712,435 B2 | 5/2010 | Yoshizaki |
| 7,718,004 B2 | 5/2010 | Satoh |
| 7,727,880 B1 | 6/2010 | Chattopadhyay et al. |
| 7,858,898 B2 | 12/2010 | Bailey et al. |
| D633,452 S | 3/2011 | Namiki et al. |
| 8,128,333 B2 | 3/2012 | Aburatani |
| 8,253,204 B2 | 8/2012 | Lee et al. |
| 8,262,800 B1 | 9/2012 | Wongsenakhum |
| 8,278,224 B1 | 10/2012 | Mui et al. |
| 8,318,584 B2 | 11/2012 | Li et al. |
| 8,334,166 B2 | 12/2012 | Beck |
| 8,404,044 B2 | 3/2013 | Arai |
| 8,435,894 B2 | 5/2013 | Chandrashekar et al. |
| 8,443,484 B2 | 5/2013 | Ozaki et al. |
| 8,507,720 B2 | 8/2013 | Shay |
| D693,782 S | 11/2013 | Mori et al. |
| 8,623,148 B2 | 1/2014 | Mitchell |
| 8,637,384 B2 | 1/2014 | Ando et al. |
| 8,784,676 B2 | 7/2014 | Guha et al. |
| 8,895,395 B1 | 11/2014 | Kerber et al. |
| 8,937,800 B2 | 1/2015 | Lubomirsky et al. |
| 8,968,989 B2 | 3/2015 | Ouattara et al. |
| 8,969,934 B1 | 3/2015 | Cheng et al. |
| 8,993,072 B2 | 3/2015 | Xiao et al. |
| 9,142,393 B2 | 9/2015 | Okabe |
| 9,214,340 B2 | 12/2015 | Kurita et al. |
| 9,281,223 B2 | 3/2016 | Hara |
| 9,337,031 B2 | 5/2016 | Kim et al. |
| D759,193 S | 6/2016 | Gutierrez et al. |
| D761,325 S | 7/2016 | Abed |
| 9,428,833 B1 | 8/2016 | Duvall et al. |
| 9,449,843 B2 | 9/2016 | Korolik et al. |
| 9,449,987 B1 | 9/2016 | Miyata et al. |
| 9,460,954 B2 | 10/2016 | De Jong et al. |
| 9,472,410 B2 | 10/2016 | Sadjadi et al. |
| 9,514,927 B2 | 12/2016 | Tolle |
| 9,605,736 B1 | 3/2017 | Foshage et al. |
| D784,276 S | 4/2017 | Tiner et al. |
| 9,618,846 B2 | 4/2017 | Shamma et al. |
| 9,653,267 B2 | 5/2017 | Carducci et al. |
| D793,526 S | 8/2017 | Behdjat |
| D794,753 S | 8/2017 | Miller |
| 9,748,104 B2 | 8/2017 | Sasaki et al. |
| D797,067 S | 9/2017 | Zhang et al. |
| D798,248 S | 9/2017 | Hanson et al. |
| D800,782 S | 10/2017 | Bever et al. |
| 9,803,926 B2 | 10/2017 | Kikuchi et al. |
| D801,942 S | 11/2017 | Riker et al. |
| D802,472 S | 11/2017 | Sasaki et al. |
| D803,802 S | 11/2017 | Sasaki et al. |
| 9,812,372 B2 | 11/2017 | Choi et al. |
| 9,824,881 B2 | 11/2017 | Niskanen et al. |
| 9,837,355 B2 | 12/2017 | Briggs et al. |
| 9,842,835 B1 | 12/2017 | Cheng et al. |
| 9,847,247 B2 | 12/2017 | Huang et al. |
| 9,850,573 B1 | 12/2017 | Sun |
| D807,494 S | 1/2018 | Kim et al. |
| 9,911,595 B1 | 3/2018 | Smith et al. |
| 9,929,055 B2 | 3/2018 | Dube et al. |
| 9,970,112 B2 | 5/2018 | Koshi et al. |
| D825,505 S | 8/2018 | Hanson et al. |
| D825,614 S | 8/2018 | Bever et al. |
| D829,306 S | 9/2018 | Ikedo et al. |
| D834,686 S | 11/2018 | Yamada et al. |
| 10,229,851 B2 | 3/2019 | Briggs et al. |
| 10,229,985 B1 | 3/2019 | Li et al. |
| D846,008 S | 4/2019 | Geldenhuys et al. |
| D849,055 S | 5/2019 | Kneip |
| 10,332,747 B1 | 6/2019 | Watanabe et al. |
| 10,395,963 B2 | 8/2019 | Cooke |
| 10,424,476 B2 | 9/2019 | Suzuki et al. |
| 10,424,477 B2 | 9/2019 | Niskanen et al. |
| D864,134 S | 10/2019 | Watarai et al. |
| 10,510,529 B2 | 12/2019 | Suzuki et al. |
| 10,590,535 B2 | 3/2020 | Huggare |
| D881,338 S | 4/2020 | Chen |
| 10,622,236 B2 | 4/2020 | Kuo et al. |
| 10,658,205 B2 | 5/2020 | Sharma |
| 10,662,525 B2 | 5/2020 | Jang et al. |
| 10,704,143 B1 | 7/2020 | Hisamitsu et al. |
| 10,720,334 B2 | 7/2020 | Vervuurt |
| 10,731,249 B2 | 8/2020 | Hatanpää et al. |
| 10,734,497 B2 | 8/2020 | Zhu et al. |
| 10,741,386 B2 | 8/2020 | Chen et al. |
| 10,770,336 B2 | 9/2020 | Hill et al. |
| D913,980 S | 3/2021 | Lee et al. |
| D914,620 S | 3/2021 | Rokkam et al. |
| 10,950,477 B2 | 3/2021 | Lin et al. |
| 11,018,003 B2 | 5/2021 | Huang et al. |
| D922,229 S | 6/2021 | Jun et al. |
| 11,053,584 B2 | 7/2021 | Hsieh et al. |
| 11,121,002 B2 | 9/2021 | Cui |
| 11,315,794 B2 | 4/2022 | Wang |
| 11,328,909 B2 | 5/2022 | Zhang |
| 2001/0003271 A1 | 6/2001 | Otsuki |
| 2001/0007244 A1 | 7/2001 | Matsuse |
| 2001/0019347 A1 | 9/2001 | Hauck |
| 2001/0024387 A1 | 9/2001 | Raaijmakers et al. |
| 2001/0027585 A1 | 10/2001 | Lee |
| 2001/0042514 A1 | 11/2001 | Mizuno et al. |
| 2001/0052556 A1 | 12/2001 | Ting et al. |
| 2001/0054381 A1 | 12/2001 | Umotoy et al. |
| 2002/0015853 A1 | 2/2002 | Wataya et al. |
| 2002/0022347 A1 | 2/2002 | Park et al. |
| 2002/0033183 A1 | 3/2002 | Sun et al. |
| 2002/0036065 A1 | 3/2002 | Yamagishi et al. |
| 2002/0047705 A1 | 4/2002 | Tada et al. |
| 2002/0052119 A1 | 5/2002 | Cleemput |
| 2002/0061716 A1 | 5/2002 | Korovin et al. |
| 2002/0079056 A1 | 6/2002 | Kudo et al. |
| 2002/0104467 A1 | 8/2002 | Chandran |
| 2002/0106909 A1 | 8/2002 | Kato et al. |

(56) References Cited

U.S. PATENT DOCUMENTS

| | | |
|---|---|---|
| 2002/0108570 A1 | 8/2002 | Lindfors |
| 2002/0117262 A1 | 8/2002 | Pang et al. |
| 2002/0127956 A1 | 9/2002 | Ashjaee et al. |
| 2003/0008602 A1 | 1/2003 | Ashjaee et al. |
| 2003/0013314 A1 | 1/2003 | Ying et al. |
| 2003/0029563 A1 | 2/2003 | Kaushal et al. |
| 2003/0049571 A1 | 3/2003 | Hallock et al. |
| 2003/0049580 A1 | 3/2003 | Goodman |
| 2003/0056726 A1 | 3/2003 | Holst et al. |
| 2003/0075107 A1 | 4/2003 | Miyano et al. |
| 2003/0111012 A1 | 6/2003 | Takeshima |
| 2003/0113995 A1 | 6/2003 | Xia et al. |
| 2003/0129835 A1 | 7/2003 | Kholodenko |
| 2003/0132319 A1 | 7/2003 | Hytros et al. |
| 2003/0143846 A1 | 7/2003 | Sekiya et al. |
| 2003/0150386 A1 | 8/2003 | Shimada |
| 2003/0157345 A1 | 8/2003 | Beldi et al. |
| 2003/0168174 A1 | 9/2003 | Foree |
| 2003/0181065 A1 | 9/2003 | O'Donnell |
| 2003/0200926 A1 | 10/2003 | Dando et al. |
| 2003/0205237 A1 | 11/2003 | Sakuma |
| 2003/0232497 A1 | 12/2003 | Xi et al. |
| 2004/0005753 A1 | 1/2004 | Kostamo et al. |
| 2004/0018694 A1 | 1/2004 | Lee et al. |
| 2004/0058517 A1 | 3/2004 | Nallan et al. |
| 2004/0069610 A1 | 4/2004 | Arno |
| 2004/0083962 A1 | 5/2004 | Bang et al. |
| 2004/0099635 A1 | 5/2004 | Nishikawa |
| 2004/0103914 A1* | 6/2004 | Cheng ............... H01J 37/32862 134/1.1 |
| 2004/0104439 A1 | 6/2004 | Haukka et al. |
| 2004/0112288 A1 | 6/2004 | Whitesell |
| 2004/0118342 A1 | 6/2004 | Cheng et al. |
| 2004/0126929 A1 | 7/2004 | Tang et al. |
| 2004/0154746 A1 | 8/2004 | Park |
| 2004/0163590 A1 | 8/2004 | Tran et al. |
| 2004/0224478 A1 | 11/2004 | Chudzik et al. |
| 2004/0226507 A1 | 11/2004 | Carpenter et al. |
| 2004/0241341 A1 | 12/2004 | Lin |
| 2004/0253790 A1 | 12/2004 | Ootsuka |
| 2004/0261706 A1 | 12/2004 | Lindfors et al. |
| 2005/0006682 A1 | 1/2005 | Bae et al. |
| 2005/0016452 A1 | 1/2005 | Ryu et al. |
| 2005/0023231 A1 | 2/2005 | Huang et al. |
| 2005/0051854 A1 | 3/2005 | Cabral et al. |
| 2005/0062773 A1 | 3/2005 | Fouet |
| 2005/0081786 A1 | 4/2005 | Kubista et al. |
| 2005/0085090 A1 | 4/2005 | Mui et al. |
| 2005/0090123 A1 | 4/2005 | Nishimura et al. |
| 2005/0092439 A1 | 5/2005 | Keeton et al. |
| 2005/0104112 A1 | 5/2005 | Haukka et al. |
| 2005/0112901 A1 | 5/2005 | Ji |
| 2005/0133166 A1 | 6/2005 | Satitpunwaycha et al. |
| 2005/0136657 A1 | 6/2005 | Yokoi et al. |
| 2005/0139578 A1 | 6/2005 | Fukuda |
| 2005/0153573 A1 | 7/2005 | Okudaira et al. |
| 2005/0164469 A1 | 7/2005 | Haupt |
| 2005/0170306 A1 | 8/2005 | Oosterlaken et al. |
| 2005/0178333 A1 | 8/2005 | Loke |
| 2005/0193952 A1 | 9/2005 | Goodman et al. |
| 2005/0221618 A1 | 10/2005 | Amrhein |
| 2005/0285208 A1 | 12/2005 | Ren et al. |
| 2006/0008997 A1 | 1/2006 | Jang et al. |
| 2006/0016783 A1 | 1/2006 | Wu |
| 2006/0017043 A1 | 1/2006 | Wu |
| 2006/0019495 A1 | 1/2006 | Marcadal et al. |
| 2006/0057858 A1 | 3/2006 | Chung et al. |
| 2006/0097220 A1 | 5/2006 | Kim et al. |
| 2006/0097305 A1 | 5/2006 | Lee |
| 2006/0110930 A1 | 5/2006 | Senzaki |
| 2006/0115589 A1 | 6/2006 | Vukovic |
| 2006/0118241 A1 | 6/2006 | Ohmi et al. |
| 2006/0130751 A1 | 6/2006 | Volfovski et al. |
| 2006/0133955 A1 | 6/2006 | Peters |
| 2006/0141758 A1 | 6/2006 | Naumann et al. |
| 2006/0148151 A1 | 7/2006 | Murthy et al. |
| 2006/0151002 A1 | 7/2006 | Kumar |
| 2006/0156979 A1 | 7/2006 | Thakur et al. |
| 2006/0162661 A1 | 7/2006 | Jung et al. |
| 2006/0176928 A1 | 8/2006 | Nakamura et al. |
| 2006/0193980 A1 | 8/2006 | Hasegawa |
| 2006/0211224 A1 | 9/2006 | Matsuda |
| 2006/0213441 A1 | 9/2006 | Kobrin et al. |
| 2006/0223337 A1 | 10/2006 | Ahn et al. |
| 2006/0249175 A1 | 11/2006 | Nowak et al. |
| 2006/0252244 A1 | 11/2006 | Vaartstra et al. |
| 2007/0006893 A1 | 1/2007 | Ji |
| 2007/0026654 A1 | 2/2007 | Huotari et al. |
| 2007/0065597 A1 | 3/2007 | Kaido et al. |
| 2007/0087515 A1 | 4/2007 | Yieh et al. |
| 2007/0092696 A1 | 4/2007 | Tsukatani et al. |
| 2007/0111030 A1 | 5/2007 | Nakano et al. |
| 2007/0117396 A1 | 5/2007 | Wu |
| 2007/0123060 A1 | 5/2007 | Rahtu |
| 2007/0128570 A1 | 6/2007 | Goto et al. |
| 2007/0128876 A1 | 6/2007 | Fukiage |
| 2007/0134821 A1 | 6/2007 | Thakur et al. |
| 2007/0144442 A1 | 6/2007 | Migita |
| 2007/0163490 A1 | 7/2007 | Habel et al. |
| 2007/0166459 A1 | 7/2007 | Chang et al. |
| 2007/0205788 A1 | 9/2007 | Natsuhara et al. |
| 2007/0207275 A1 | 9/2007 | Nowak |
| 2007/0215278 A1 | 9/2007 | Furuse et al. |
| 2007/0222131 A1 | 9/2007 | Fukumoto et al. |
| 2007/0227554 A1 | 10/2007 | Satoh |
| 2007/0248767 A1 | 10/2007 | Okura |
| 2007/0248832 A1 | 10/2007 | Maeda et al. |
| 2007/0264427 A1 | 11/2007 | Shinriki et al. |
| 2007/0264793 A1 | 11/2007 | Oh et al. |
| 2007/0281106 A1 | 12/2007 | Lubomirsky et al. |
| 2008/0032514 A1 | 2/2008 | Sano et al. |
| 2008/0044932 A1 | 2/2008 | Samoilov et al. |
| 2008/0066778 A1 | 3/2008 | Matsushita |
| 2008/0069951 A1 | 3/2008 | Chacin et al. |
| 2008/0092821 A1 | 4/2008 | Otsuka et al. |
| 2008/0110401 A1 | 5/2008 | Fujikawa et al. |
| 2008/0110568 A1 | 5/2008 | Son et al. |
| 2008/0135516 A1 | 6/2008 | Yokogawa et al. |
| 2008/0135936 A1 | 6/2008 | Nakajima |
| 2008/0142039 A1 | 6/2008 | Chen |
| 2008/0142046 A1 | 6/2008 | Johnson et al. |
| 2008/0157212 A1 | 7/2008 | Lavoie et al. |
| 2008/0194088 A1 | 8/2008 | Srinivasan et al. |
| 2008/0194113 A1 | 8/2008 | Kim et al. |
| 2008/0210162 A1 | 9/2008 | Yonebayashi |
| 2008/0223725 A1 | 9/2008 | Han et al. |
| 2008/0229811 A1 | 9/2008 | Zhao et al. |
| 2008/0230352 A1 | 9/2008 | Hirata |
| 2008/0237604 A1 | 10/2008 | Alshareef et al. |
| 2008/0246101 A1 | 10/2008 | Li et al. |
| 2008/0276864 A1 | 11/2008 | Koelmel et al. |
| 2008/0293198 A1 | 11/2008 | Kojima et al. |
| 2009/0031954 A1 | 2/2009 | Nishikido et al. |
| 2009/0035463 A1 | 2/2009 | Dip |
| 2009/0035946 A1 | 2/2009 | Pierreux et al. |
| 2009/0047447 A1 | 2/2009 | Sawin |
| 2009/0060480 A1 | 3/2009 | Herchen |
| 2009/0080136 A1 | 3/2009 | Nagayama et al. |
| 2009/0093100 A1 | 4/2009 | Xia et al. |
| 2009/0095713 A1* | 4/2009 | Dimeo, Jr. ........ H01J 37/32862 156/345.37 |
| 2009/0117723 A1 | 5/2009 | Kim et al. |
| 2009/0176018 A1 | 7/2009 | Zou et al. |
| 2009/0236315 A1 | 9/2009 | Willwerth et al. |
| 2009/0246399 A1 | 10/2009 | Goundar |
| 2009/0269506 A1 | 10/2009 | Okura |
| 2009/0291566 A1 | 11/2009 | Ueno et al. |
| 2009/0297696 A1 | 12/2009 | Pore et al. |
| 2009/0297731 A1 | 12/2009 | Goundar |
| 2009/0302002 A1 | 12/2009 | Collins |
| 2009/0314309 A1 | 12/2009 | Sankarakrishnan et al. |
| 2010/0008656 A1 | 1/2010 | Sorabji et al. |
| 2010/0012153 A1 | 1/2010 | Shigemoto et al. |

(56) References Cited

U.S. PATENT DOCUMENTS

| | | |
|---|---|---|
| 2010/0022095 A1* | 1/2010 | Wu .................. B08B 7/0035 438/719 |
| 2010/0031884 A1 | 2/2010 | Aggarwal et al. |
| 2010/0038687 A1 | 2/2010 | Klaus et al. |
| 2010/0075488 A1 | 3/2010 | Collins et al. |
| 2010/0116208 A1 | 5/2010 | Sangam |
| 2010/0119844 A1 | 5/2010 | Sun et al. |
| 2010/0121100 A1 | 5/2010 | Shay |
| 2010/0129670 A1 | 5/2010 | Sun et al. |
| 2010/0133255 A1 | 6/2010 | Bahng et al. |
| 2010/0147396 A1 | 6/2010 | Yamagishi et al. |
| 2010/0154835 A1* | 6/2010 | Dimeo ............... C23C 16/4405 134/31 |
| 2010/0163187 A1 | 7/2010 | Yokogawa et al. |
| 2010/0178423 A1 | 7/2010 | Shimizu et al. |
| 2010/0195690 A1 | 8/2010 | Moench et al. |
| 2010/0258809 A1 | 10/2010 | Muller |
| 2010/0322822 A1 | 12/2010 | Fritchie et al. |
| 2011/0041872 A1 | 2/2011 | Hogle |
| 2011/0089419 A1 | 4/2011 | Yamazaki et al. |
| 2011/0091650 A1 | 4/2011 | Noguchi et al. |
| 2011/0100489 A1 | 5/2011 | Orito et al. |
| 2011/0117728 A1 | 5/2011 | Su et al. |
| 2011/0127702 A1 | 6/2011 | Gautam et al. |
| 2011/0171380 A1 | 7/2011 | Higashi et al. |
| 2011/0186984 A1 | 8/2011 | Saito et al. |
| 2011/0195574 A1 | 8/2011 | Blasco et al. |
| 2011/0203610 A1 | 8/2011 | Leu |
| 2011/0212625 A1 | 9/2011 | Toyoda et al. |
| 2011/0237082 A1 | 9/2011 | Nakajima et al. |
| 2011/0256692 A1 | 10/2011 | Tam et al. |
| 2011/0286819 A1 | 11/2011 | Shibata et al. |
| 2011/0297088 A1 | 12/2011 | Song et al. |
| 2011/0305856 A1 | 12/2011 | Bonn |
| 2011/0318142 A1 | 12/2011 | Gage et al. |
| 2012/0003599 A1 | 1/2012 | Patalay et al. |
| 2012/0027547 A1 | 2/2012 | Jager et al. |
| 2012/0055401 A1 | 3/2012 | Tozawa |
| 2012/0077350 A1 | 3/2012 | Miya et al. |
| 2012/0088369 A1 | 4/2012 | Weidman et al. |
| 2012/0094010 A1 | 4/2012 | Sugiura et al. |
| 2012/0108039 A1 | 5/2012 | Zojaji et al. |
| 2012/0111271 A1 | 5/2012 | Begarney et al. |
| 2012/0177845 A1 | 7/2012 | Odedra et al. |
| 2012/0187375 A1 | 7/2012 | Guo et al. |
| 2012/0196242 A1 | 8/2012 | Volfovski et al. |
| 2012/0219735 A1 | 8/2012 | Bakker et al. |
| 2012/0222813 A1 | 9/2012 | Pal et al. |
| 2012/0231611 A1 | 9/2012 | Gatineau et al. |
| 2012/0263875 A1 | 10/2012 | Brenninger et al. |
| 2012/0269962 A1 | 10/2012 | Blomberg |
| 2012/0270384 A1 | 10/2012 | Sanchez et al. |
| 2012/0270407 A1 | 10/2012 | Werner et al. |
| 2012/0276306 A1 | 11/2012 | Ueda |
| 2012/0289061 A1 | 11/2012 | Nguyen |
| 2012/0320491 A1 | 12/2012 | Doh et al. |
| 2012/0329208 A1 | 12/2012 | Pore et al. |
| 2013/0011630 A1 | 1/2013 | Sullivan et al. |
| 2013/0012003 A1 | 1/2013 | Haukka et al. |
| 2013/0017503 A1 | 1/2013 | De Ridder et al. |
| 2013/0037532 A1 | 2/2013 | Volfovski et al. |
| 2013/0048606 A1* | 2/2013 | Mao .................. C23F 4/00 216/67 |
| 2013/0059415 A1 | 3/2013 | Kato et al. |
| 2013/0062839 A1 | 3/2013 | Tschinderle et al. |
| 2013/0068391 A1 | 3/2013 | Mazzocco et al. |
| 2013/0075788 A1 | 3/2013 | Tomabechi |
| 2013/0085618 A1 | 4/2013 | Ding |
| 2013/0089988 A1 | 4/2013 | Wang et al. |
| 2013/0109172 A1 | 5/2013 | Collins et al. |
| 2013/0109192 A1 | 5/2013 | Hawkins et al. |
| 2013/0147050 A1 | 6/2013 | Bonner, III et al. |
| 2013/0149874 A1 | 6/2013 | Hirose et al. |
| 2013/0162142 A1 | 6/2013 | Nishino et al. |
| 2013/0203258 A1 | 8/2013 | Chen et al. |
| 2013/0206066 A1 | 8/2013 | Han et al. |
| 2013/0213300 A1 | 8/2013 | Sung et al. |
| 2013/0216710 A1 | 8/2013 | Masuda et al. |
| 2013/0220364 A1 | 8/2013 | Cigal |
| 2013/0220550 A1 | 8/2013 | Koo et al. |
| 2013/0230987 A1 | 9/2013 | Draeger et al. |
| 2013/0247937 A1 | 9/2013 | Nunomura et al. |
| 2013/0270600 A1 | 10/2013 | Helander et al. |
| 2013/0273330 A1 | 10/2013 | Wang et al. |
| 2013/0335383 A1* | 12/2013 | Sasagawa ............ C23F 4/00 359/290 |
| 2014/0024223 A1 | 1/2014 | Kilpi et al. |
| 2014/0053867 A1 | 2/2014 | Fang |
| 2014/0057187 A1 | 2/2014 | Suzuki et al. |
| 2014/0080314 A1 | 3/2014 | Sasajima et al. |
| 2014/0116335 A1 | 5/2014 | Tsuji |
| 2014/0120312 A1 | 5/2014 | He et al. |
| 2014/0127422 A1 | 5/2014 | Shao et al. |
| 2014/0158154 A1 | 6/2014 | Kondo et al. |
| 2014/0170320 A1 | 6/2014 | Yamamoto et al. |
| 2014/0179092 A1 | 6/2014 | Kim |
| 2014/0187022 A1 | 7/2014 | Falster et al. |
| 2014/0190581 A1 | 7/2014 | Nagase et al. |
| 2014/0217065 A1 | 8/2014 | Winkler |
| 2014/0242808 A1 | 8/2014 | Akiyama et al. |
| 2014/0252710 A1 | 9/2014 | Cuvalci et al. |
| 2014/0256160 A1 | 9/2014 | Wada et al. |
| 2014/0271081 A1 | 9/2014 | Lavitsky et al. |
| 2014/0290573 A1 | 10/2014 | Okabe et al. |
| 2014/0326276 A1 | 11/2014 | Wu |
| 2014/0327117 A1 | 11/2014 | Bencher et al. |
| 2014/0346600 A1 | 11/2014 | Cheng et al. |
| 2014/0360430 A1 | 12/2014 | Armour et al. |
| 2015/0004806 A1 | 1/2015 | Ndiege et al. |
| 2015/0024567 A1 | 1/2015 | Tsai et al. |
| 2015/0024609 A1 | 1/2015 | Milligan |
| 2015/0030782 A1 | 1/2015 | Ivanov et al. |
| 2015/0061078 A1 | 3/2015 | Abel et al. |
| 2015/0069354 A1 | 3/2015 | Helander et al. |
| 2015/0104575 A1 | 4/2015 | Takoudis et al. |
| 2015/0110968 A1 | 4/2015 | Lavoie et al. |
| 2015/0126036 A1 | 5/2015 | Zhao |
| 2015/0132953 A1 | 5/2015 | Nowling et al. |
| 2015/0137315 A1 | 5/2015 | Chen et al. |
| 2015/0144154 A1* | 5/2015 | Cho .................. B08B 7/0035 134/1.1 |
| 2015/0155140 A1 | 6/2015 | Lee et al. |
| 2015/0155177 A1 | 6/2015 | Zhang |
| 2015/0155370 A1 | 6/2015 | Tsai et al. |
| 2015/0170907 A1 | 6/2015 | Haukka et al. |
| 2015/0176124 A1 | 6/2015 | Greer et al. |
| 2015/0247259 A1 | 9/2015 | Hekmatshoar-Tabari et al. |
| 2015/0252479 A1 | 9/2015 | Nakano |
| 2015/0267299 A1 | 9/2015 | Hawkins et al. |
| 2015/0275355 A1 | 10/2015 | Mallikarjunan et al. |
| 2015/0307989 A1 | 10/2015 | Lindfors |
| 2015/0311043 A1 | 10/2015 | Sun et al. |
| 2015/0340266 A1 | 11/2015 | Ngo et al. |
| 2016/0005596 A1 | 1/2016 | Behera et al. |
| 2016/0010208 A1 | 1/2016 | Huang et al. |
| 2016/0032453 A1 | 2/2016 | Qian et al. |
| 2016/0035542 A1 | 2/2016 | Hausmann |
| 2016/0086811 A1 | 3/2016 | Mackedanz et al. |
| 2016/0111304 A1 | 4/2016 | Takahashi et al. |
| 2016/0133504 A1 | 5/2016 | Chu et al. |
| 2016/0152649 A1 | 6/2016 | Gordon |
| 2016/0168704 A1 | 6/2016 | Choi et al. |
| 2016/0169766 A1 | 6/2016 | Ishibashi et al. |
| 2016/0204005 A1 | 7/2016 | Oki et al. |
| 2016/0204436 A1 | 7/2016 | Barker et al. |
| 2016/0211166 A1 | 7/2016 | Yan et al. |
| 2016/0215387 A1 | 7/2016 | Liu et al. |
| 2016/0225588 A1 | 8/2016 | Shaikh et al. |
| 2016/0237559 A1 | 8/2016 | Tsuji |
| 2016/0265112 A1 | 9/2016 | Tolle |
| 2016/0273095 A1 | 9/2016 | Lin et al. |
| 2016/0273128 A1 | 9/2016 | Kang |
| 2016/0279629 A1 | 9/2016 | Michishita et al. |
| 2016/0293609 A1 | 10/2016 | Jha et al. |

(56) References Cited

U.S. PATENT DOCUMENTS

| | | |
|---|---|---|
| 2016/0307740 A1 | 10/2016 | Kim et al. |
| 2016/0314960 A1 | 10/2016 | Cheng et al. |
| 2016/0343612 A1 | 11/2016 | Wang et al. |
| 2016/0362782 A1 | 12/2016 | Cheng |
| 2016/0376701 A1 | 12/2016 | Takewaki et al. |
| 2017/0022612 A1 | 1/2017 | Lei et al. |
| 2017/0040146 A1 | 2/2017 | Huang et al. |
| 2017/0040198 A1 | 2/2017 | Lin et al. |
| 2017/0062224 A1 | 3/2017 | Fu et al. |
| 2017/0102612 A1 | 4/2017 | Meyers et al. |
| 2017/0130332 A1 | 5/2017 | Stumpf |
| 2017/0140924 A1 | 5/2017 | Suzuki et al. |
| 2017/0167023 A1 | 6/2017 | Proia et al. |
| 2017/0178939 A1 | 6/2017 | Omori |
| 2017/0178942 A1 | 6/2017 | Sakata et al. |
| 2017/0191685 A1 | 7/2017 | Ronne et al. |
| 2017/0213960 A1 | 7/2017 | de Araujo et al. |
| 2017/0218515 A1 | 8/2017 | Shin et al. |
| 2017/0222008 A1 | 8/2017 | Hsu et al. |
| 2017/0253968 A1 | 9/2017 | Yahata |
| 2017/0256393 A1 | 9/2017 | Kim et al. |
| 2017/0263438 A1 | 9/2017 | Li et al. |
| 2017/0271143 A1 | 9/2017 | Fukiage et al. |
| 2017/0283312 A1 | 10/2017 | Lee et al. |
| 2017/0283313 A1 | 10/2017 | Lee et al. |
| 2017/0306494 A1 | 10/2017 | Lin et al. |
| 2017/0314125 A1 | 11/2017 | Fenwick et al. |
| 2017/0369993 A1 | 12/2017 | Sun |
| 2018/0036775 A1 | 2/2018 | Shah |
| 2018/0047621 A1 | 2/2018 | Armini |
| 2018/0094350 A1 | 4/2018 | Verghese et al. |
| 2018/0096821 A1 | 4/2018 | Lubomirsky |
| 2018/0096844 A1 | 4/2018 | Dutartre et al. |
| 2018/0105701 A1 | 4/2018 | Larsson et al. |
| 2018/0171472 A1 | 6/2018 | Yamada et al. |
| 2018/0182597 A1 | 6/2018 | Blomberg |
| 2018/0182613 A1 | 6/2018 | Blanquart |
| 2018/0209042 A1 | 7/2018 | Wu et al. |
| 2018/0265294 A1 | 9/2018 | Hayashi |
| 2018/0265972 A1 | 9/2018 | Firouzdor et al. |
| 2018/0265973 A1 | 9/2018 | Firouzdor et al. |
| 2018/0274098 A1 | 9/2018 | Takagi et al. |
| 2018/0315597 A1 | 11/2018 | Varadarajan et al. |
| 2018/0327892 A1 | 11/2018 | Wu et al. |
| 2018/0327898 A1 | 11/2018 | Wu et al. |
| 2018/0327899 A1 | 11/2018 | Wu et al. |
| 2019/0019714 A1 | 1/2019 | Kosakai et al. |
| 2019/0035698 A1 | 1/2019 | Tanaka |
| 2019/0067094 A1* | 2/2019 | Zope ................. C23C 16/0272 |
| 2019/0078206 A1 | 3/2019 | Wu et al. |
| 2019/0109043 A1 | 4/2019 | Wang et al. |
| 2019/0115451 A1 | 4/2019 | Lee et al. |
| 2019/0148177 A1 | 5/2019 | Yin et al. |
| 2019/0148556 A1 | 5/2019 | Wang et al. |
| 2019/0172701 A1 | 6/2019 | Jia et al. |
| 2019/0172714 A1 | 6/2019 | Bobek et al. |
| 2019/0176435 A1 | 6/2019 | Bellman et al. |
| 2019/0198297 A1 | 6/2019 | Aramaki et al. |
| 2019/0211450 A1 | 7/2019 | Adachi et al. |
| 2019/0233446 A1 | 8/2019 | MacDonald et al. |
| 2019/0318910 A1 | 10/2019 | Mori |
| 2019/0319100 A1 | 10/2019 | Chen et al. |
| 2019/0362970 A1 | 11/2019 | Wang et al. |
| 2019/0362989 A1 | 11/2019 | Reuter et al. |
| 2019/0363015 A1 | 11/2019 | Cheng et al. |
| 2019/0378711 A1 | 12/2019 | Suzuki et al. |
| 2019/0393304 A1 | 12/2019 | Guillorn et al. |
| 2020/0012081 A1 | 1/2020 | Komai |
| 2020/0035489 A1 | 1/2020 | Huang et al. |
| 2020/0052089 A1 | 2/2020 | Yu et al. |
| 2020/0058469 A1 | 2/2020 | Ranjan et al. |
| 2020/0066512 A1 | 2/2020 | Tois et al. |
| 2020/0105895 A1 | 4/2020 | Tang et al. |
| 2020/0119038 A1 | 4/2020 | Hopkins et al. |
| 2020/0131634 A1 | 4/2020 | Gao et al. |
| 2020/0135915 A1 | 4/2020 | Savant et al. |
| 2020/0185249 A1 | 6/2020 | Rice et al. |
| 2020/0185257 A1 | 6/2020 | Nishiwaki |
| 2020/0203157 A1 | 6/2020 | Su |
| 2020/0273728 A1 | 8/2020 | Benjaminson et al. |
| 2020/0283894 A1 | 9/2020 | Lehn et al. |
| 2020/0312681 A1 | 10/2020 | Tanaka et al. |
| 2020/0395199 A1 | 12/2020 | Miyama |
| 2020/0402846 A1 | 12/2020 | Collins et al. |
| 2021/0013034 A1 | 1/2021 | Wu et al. |
| 2021/0032754 A1 | 2/2021 | White et al. |
| 2021/0033977 A1 | 2/2021 | Raaijmakers et al. |
| 2021/0054500 A1 | 2/2021 | Zope et al. |
| 2021/0054504 A1 | 2/2021 | Wang et al. |
| 2021/0057214 A1 | 2/2021 | Kengoyama et al. |
| 2021/0057223 A1 | 2/2021 | Stevens et al. |
| 2021/0057275 A1 | 2/2021 | Pierreux et al. |
| 2021/0057570 A1 | 2/2021 | Lin et al. |
| 2021/0066075 A1 | 3/2021 | Zhang et al. |
| 2021/0066079 A1 | 3/2021 | Lima et al. |
| 2021/0066080 A1 | 3/2021 | Mattinen et al. |
| 2021/0066083 A1 | 3/2021 | Haukka |
| 2021/0066084 A1 | 3/2021 | Raisanen et al. |
| 2021/0070783 A1 | 3/2021 | Odedra et al. |
| 2021/0071296 A1 | 3/2021 | Watarai et al. |
| 2021/0071298 A1 | 3/2021 | Maes et al. |
| 2021/0074527 A1 | 3/2021 | Lee et al. |
| 2021/0079533 A1 | 3/2021 | Shirasawa |
| 2021/0082692 A1 | 3/2021 | Kikuchi |
| 2021/0090878 A1 | 3/2021 | Kang et al. |
| 2021/0095372 A1 | 4/2021 | Minjauw et al. |
| 2021/0102289 A1 | 4/2021 | Tsuji et al. |
| 2021/0102290 A1 | 4/2021 | Acosta et al. |
| 2021/0102292 A1 | 4/2021 | Lin et al. |
| 2021/0104384 A1 | 4/2021 | Parkhe |
| 2021/0104399 A1 | 4/2021 | Kuroda et al. |
| 2021/0108328 A1 | 4/2021 | Yanagisawa |
| 2021/0111025 A1 | 4/2021 | Zyulkov et al. |
| 2021/0111053 A1 | 4/2021 | Ridder |
| 2021/0118667 A1 | 4/2021 | Fukazawa et al. |
| 2021/0118679 A1 | 4/2021 | Lima et al. |
| 2021/0118687 A1 | 4/2021 | Wang et al. |
| 2021/0125827 A1 | 4/2021 | Khazaka et al. |
| 2021/0125832 A1 | 4/2021 | Bhatnagar |
| 2021/0134588 A1 | 5/2021 | Kohen et al. |
| 2021/0134959 A1 | 5/2021 | Lima et al. |
| 2021/0140043 A1 | 5/2021 | Thombare et al. |
| 2021/0143003 A1 | 5/2021 | Fukuda et al. |
| 2021/0151315 A1 | 5/2021 | Pierreux et al. |
| 2021/0151348 A1 | 5/2021 | Utsuno et al. |
| 2021/0151352 A1 | 5/2021 | Zope et al. |
| 2021/0156024 A1 | 5/2021 | Roh et al. |
| 2021/0156056 A1 | 5/2021 | Shugrue |
| 2021/0159077 A1 | 5/2021 | Longrie et al. |
| 2021/0166910 A1 | 6/2021 | Kim et al. |
| 2021/0166924 A1 | 6/2021 | Moon et al. |
| 2021/0166925 A1 | 6/2021 | Moon et al. |
| 2021/0166940 A1 | 6/2021 | Nozawa |
| 2021/0172064 A1 | 6/2021 | Moon |
| 2021/0175052 A1 | 6/2021 | Takahashi et al. |
| 2021/0180184 A1 | 6/2021 | Verni et al. |
| 2021/0180188 A1 | 6/2021 | Kim et al. |
| 2021/0180189 A1 | 6/2021 | Shugrue et al. |
| 2021/0193458 A1 | 6/2021 | Salmi et al. |
| 2021/0205758 A1 | 7/2021 | Kimtee et al. |
| 2021/0207269 A1 | 7/2021 | Huang et al. |
| 2021/0207270 A1 | 7/2021 | de Ridder et al. |
| 2021/0210373 A1 | 7/2021 | Singu et al. |
| 2021/0214842 A1 | 7/2021 | Yoon et al. |
| 2021/0225615 A1 | 7/2021 | Yoshida |
| 2021/0225622 A1 | 7/2021 | Shoji |
| 2021/0225642 A1 | 7/2021 | Utsuno et al. |
| 2021/0225643 A1 | 7/2021 | Kuroda et al. |
| 2021/0230744 A1 | 7/2021 | Kimtee et al. |
| 2021/0230746 A1 | 7/2021 | Shiba |
| 2021/0233772 A1 | 7/2021 | Zhu et al. |
| 2021/0238736 A1 | 8/2021 | Butail et al. |
| 2021/0238742 A1 | 8/2021 | Susa et al. |
| 2021/0239614 A1 | 8/2021 | Muralidhar et al. |

(56) References Cited

U.S. PATENT DOCUMENTS

| | | | |
|---|---|---|---|
| 2021/0242011 A1 | 8/2021 | Shero et al. | |
| 2021/0246556 A1 | 8/2021 | Mori | |
| 2021/0247693 A1 | 8/2021 | Maes et al. | |
| 2021/0249303 A1 | 8/2021 | Blanquart | |
| 2021/0254216 A1 | 8/2021 | Mori et al. | |
| 2021/0254238 A1 | 8/2021 | Khazaka et al. | |
| 2021/0257213 A1 | 8/2021 | Kikuchi et al. | |
| 2021/0257509 A1 | 8/2021 | Nishiwaki | |
| 2021/0265134 A1 | 8/2021 | Singh et al. | |
| 2021/0265158 A1 | 8/2021 | Kaneko | |
| 2021/0268554 A1 | 9/2021 | Mori | |
| 2021/0269914 A1 | 9/2021 | Väyrynen et al. | |
| 2021/0272821 A1 | 9/2021 | Oosterlaken | |
| 2021/0273109 A1 | 9/2021 | Yamazaki et al. | |
| 2021/0280448 A1 | 9/2021 | Ganguli et al. | |
| 2021/0285102 A1 | 9/2021 | Yoon et al. | |
| 2021/0287878 A1 | 9/2021 | Um et al. | |
| 2021/0287912 A1 | 9/2021 | Shiba | |
| 2021/0287928 A1 | 9/2021 | Kim et al. | |
| 2021/0288476 A1 | 9/2021 | Wei | |
| 2021/0292902 A1 | 9/2021 | Kajbafvala et al. | |
| 2021/0296130 A1 | 9/2021 | Longrie et al. | |
| 2021/0296144 A1 | 9/2021 | Lin et al. | |
| 2021/0310125 A1 | 10/2021 | Ma et al. | |
| 2021/0313150 A1 | 10/2021 | Kang et al. | |
| 2021/0313167 A1 | 10/2021 | Pore et al. | |
| 2021/0313170 A1 | 10/2021 | Suzuki | |
| 2021/0313178 A1 | 10/2021 | Nakano | |
| 2021/0313182 A1 | 10/2021 | Zhu et al. | |
| 2021/0317576 A1 | 10/2021 | Väyrynen et al. | |
| 2021/0319982 A1 | 10/2021 | Kim et al. | |
| 2021/0320003 A1 | 10/2021 | Sugiura et al. | |
| 2021/0320010 A1 | 10/2021 | Wang et al. | |
| 2021/0320020 A1 | 10/2021 | Oosterlaken et al. | |
| 2021/0324510 A1 | 10/2021 | Kuwano et al. | |
| 2021/0324518 A1 | 10/2021 | de Ridder | |
| 2021/0327704 A1 | 10/2021 | Kajbafvala et al. | |
| 2021/0327714 A1 | 10/2021 | Lee et al. | |
| 2021/0327715 A1 | 10/2021 | Xie et al. | |
| 2021/0328036 A1 | 10/2021 | Li et al. | |
| 2021/0348271 A1* | 11/2021 | Mishra | C23C 16/452 |
| 2022/0005693 A1 | 1/2022 | Mizoguchi | |
| 2022/0102163 A1 | 3/2022 | Chang | |
| 2022/0130668 A1 | 4/2022 | Tolle | |
| 2022/0301856 A1 | 9/2022 | Wei | |
| 2022/0319834 A1 | 10/2022 | Vervuurt | |
| 2022/0367175 A1 | 11/2022 | Lin | |
| 2022/0384203 A1 | 12/2022 | Wang | |
| 2023/0145240 A1 | 5/2023 | Tolle | |
| 2023/0207309 A1 | 6/2023 | Pore | |

FOREIGN PATENT DOCUMENTS

| | | | |
|---|---|---|---|
| CN | 102094183 | 6/2011 | |
| CN | 102539019 | 9/2013 | |
| CN | 203721699 | 7/2014 | |
| CN | 104307264 | 1/2015 | |
| CN | 104498895 | 4/2015 | |
| CN | 104517892 | 4/2015 | |
| CN | 204629865 | 9/2015 | |
| CN | 205448240 | 8/2016 | |
| CN | 104342637 | 2/2017 | |
| CN | 206145834 | 5/2017 | |
| CN | 104233226 | 6/2017 | |
| CN | 106895521 | 6/2017 | |
| CN | 104630735 | 12/2017 | |
| CN | 107675144 | 2/2018 | |
| CN | 106011785 | 10/2018 | |
| CN | 108910843 | 11/2018 | |
| CN | 109000352 | 12/2018 | |
| EP | 0634785 | 1/1995 | |
| FR | 2708624 | 2/1995 | |
| GB | 400010 | 10/1933 | |
| GB | 2051875 | 1/1981 | |
| JP | S5979545 | 5/1984 | |
| JP | S59127847 | 7/1984 | |
| JP | S60110133 | 6/1985 | |
| JP | H0165766 | 6/1989 | |
| JP | H01185176 | 7/1989 | |
| JP | H01313954 | 12/1989 | |
| JP | H03211753 | 9/1991 | |
| JP | 2002118066 | 4/2002 | |
| JP | 2004088077 | 3/2004 | |
| JP | 2004244298 | 9/2004 | |
| JP | 2005033221 | 9/2004 | |
| JP | 2006124831 | 5/2006 | |
| JP | 2015021175 | 2/2015 | |
| JP | 2017220011 | 12/2017 | |
| JP | 2018011007 A * | 1/2018 | ........ H01J 37/32862 |
| KR | 20000000946 | 1/2000 | |
| KR | 100273261 | 12/2000 | |
| KR | 20070041701 | 4/2007 | |
| KR | 10-2007-0117817 | 12/2007 | |
| KR | 10-2010-0015073 | 2/2010 | |
| KR | 10-2010-0122701 | 11/2010 | |
| KR | 10-2011-0058534 | 6/2011 | |
| KR | 10-2013-0129149 | 11/2013 | |
| KR | 101758892 | 7/2017 | |
| TW | 201213596 | 4/2012 | |
| TW | 201234453 | 8/2012 | |
| WO | 2004007800 | 1/2004 | |
| WO | 2007088940 | 8/2007 | |
| WO | 2013177269 | 11/2013 | |
| WO | 2015127614 | 9/2015 | |
| WO | 2016019795 | 2/2016 | |
| WO | 2017125401 | 7/2017 | |
| WO | 2019142055 | 7/2019 | |
| WO | 2019214578 | 11/2019 | |
| WO | 2020118100 | 6/2020 | |
| WO | 2021072042 | 4/2021 | |

OTHER PUBLICATIONS

MKS ("Astron AX7670", Copyright 2005, p. 2). (Year: 2005).*
TIPO; Notice of Allowance dated Jun. 12, 2014 in Application No. 98117513.
TIPO; Notice of Allowance dated Jan. 28, 2015 in Application No. 99114329.
TIPO; Notice of Allowance dated Apr. 28, 2015 in Application No. 99114330.
TIPO; Notice of Allowance dated Oct. 16, 2015 in Application No. 99114331.
TIPO; Notice of Allowance dated Oct. 2, 2015 in Application No. 100130472.
TIPO; Notice of Allowance dated Oct. 19, 2016 in Application No. 101124745.
TIPO; Notice of Allowance dated Jul. 18, 2017 in Application No. 102127065.
TIPO; Notice of Allowance dated Jan. 26, 2017 in Application No. 102131839.
TIPO; Notice of Allowance dated Oct. 20, 2017 in Application No. 103105251.
TIPO; Notice of Allowance dated Jan. 22, 2018 in Application No. 103117477.
TIPO; Notice of Allowance dated Mar. 13, 2018 in Application No. 103117478.
TIPO; Notice of Allowance dated Dec. 11, 2017 in Application No. 103127734.
TIPO; Notice of Allowance dated Jan. 30, 2019 in Application No. 103132230.
TIPO; Notice of Allowance dated Apr. 19, 2018 in Application No. 103134537.
TIPO; Notice of Allowance dated Oct. 17, 2017 in Application No. 103136251.
TIPO; Notice of Allowance dated Jun. 13, 2018 in Application No. 103138510.
TIPO; Notice of Allowance dated Sep. 27, 2019 in Application No. 104105533.
TIPO; Notice of Allowance dated May 9, 2019 in Application No. 104107876.

(56) References Cited

OTHER PUBLICATIONS

TIPO; Notice of Allowance dated May 8, 2019 in Application No. 104110326.
TIPO; Notice of Allowance dated Sep. 18, 2018 in Application No. 104111910.
TIPO; Notice of Allowance dated Jun. 19, 2019 in Application No. 104124377.
TIPO; Notice of Allowance dated Nov. 27, 2019 in Application No. 104141679.
TIPO; Notice of Allowance dated May 7, 2019 in Application No. 105104453.
TIPO; Notice of Allowance dated May 7, 2019 in Application No. 105114105.
TIPO; Notice of Allowance dated Aug. 31, 2020 in Application No. 105122586.
TIPO; Notice of Allowance dated Sep. 25, 2020 in Application No. 105130130.
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5.
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.
TIPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.

(56) References Cited

OTHER PUBLICATIONS

TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.

(56) References Cited

OTHER PUBLICATIONS

USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Final Office Action dated May 12, 2021 in U.S. Appl. No. 16/546,543.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/.254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of The Electrochemical Society, 152(5) G361-G366 (2005).

(56) References Cited

OTHER PUBLICATIONS

Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pages, G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2Cl6 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1—xO2—d (x=0.25) high-k dielectrics for advanced gate stacks" Applied Physics Letters, 94, 3 pages (2009).
U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechanism of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).
Zientara et al. Journal of the European Ceramic Society, 27, Abstract, 1 page (2007).
CNIPA; Office Action dated Mar. 30, 2021 in Application No. 201610131743.1.
CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.

(56) References Cited

OTHER PUBLICATIONS

CNIPA; Notice of Allowance dated Apr. 7, 2021 in Application No. 202030579755.8.
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139.
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 21 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.
USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.

(56) References Cited

OTHER PUBLICATIONS

USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; EX Parte Quayle Action dated Apr. 13, 2021 in U.S. Appl. No. 29/679,620.
USPTO; Notice of Allowance dated May 19, 2021 in U.S. Appl. No. 29/702,881.
Aubin et al. "Very low temperature (450° C.) selective epitaxial growth of heavily in situ boron-doped SiGe layers" Semiconductor Science and Technology, 30, 10 pages (2015).
Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of Al2O3 with Alcohol Oxidants for Impeding Substrate Oxidation" Abstract. Oct. 16, 2019 (2019).
Imamura et al. "Cyclic C4F8 and O2 plasma etching of TiO2 for high-aspect-ratio three-dimensional devices" Template for JJAP Regular Papers, Jan. 2014, pp. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).

(56) References Cited

OTHER PUBLICATIONS

Musschoot et al. "Atomic layer deposition of titanium nitride from TDMAT precursor" Microelectronic Engineering, 86, pp. 72-77 (2009).

Noircler et al. "Transmission electron microscopy characterization of low temperature boron doped silicon epitaxial films" CrystEngComm, 22(33), pp. 5464-5472 (2020).

Oyama et al. "Topotactic synthesis of vanadium nitride solid foams" Journal of Materials Research vol. 8. No. 6, pp. 1450-1454 (1993).

Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).

Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).

Tao et al. "Improved performance of GeON as charge storage layer in flash memory by optimal annealing" Microelectronics Reliability, vol. 52, pp. 2597-2601 (2012).

Wirths et al. "Low temperature RPCVD epitaxial growth of $Si_xGe_x$ using $Si_2H_6$ and $Ge_2H_6$" Solid-State Electronics, 88, pp. 2-9 (2013).

Yanguas-Gil et al. "Modulation of the Growth Per Cycle in Atomic Layer Deposition Using Reversible Surface Functionalization" Chemistry of Materials, 25, pp. 4849-4860 (2013).

\* cited by examiner

APPARATUS AND METHODS FOR PERFORMING AN IN-SITU ETCH OF REACTION CHAMBERS WITH FLUORINE-BASED RADICALS

CROSS-REFERENCE TO RELATED APPLICATIONS

This application is a Nonprovisional of, and claims priority to and the benefit of, U.S. Provisional Patent Application No. 63/021,514, filed May 7, 2020 and entitled "APPARATUS AND METHODS FOR PERFORMING AN IN-SITU ETCH OF REACTION CHAMBERS WITH FLUORINE-BASED RADICALS," which is hereby incorporated by reference herein.

FIELD OF INVENTION

The present disclosure relates generally to an apparatus and methods for cleaning a reaction chamber after a film has been deposited on interior walls of the reaction chamber. The present disclosure more specifically relates to using halogen-based radicals for performing the cleaning or an in-situ etch of the deposited film.

BACKGROUND OF THE DISCLOSURE

Semiconductor fabrication processes for forming semiconductor device structures, such as, for example, transistors, memory elements, and integrated circuits, are wide ranging and may include deposition processes. The deposition processes may result in films such as molybdenum or molybdenum nitride deposited on the substrates.

During the deposition processes, the molybdenum or molybdenum nitride films may also accumulate on interior walls of the reaction chamber. If too much of these films accumulate on the walls, adverse effects may occur such as drifting process performance due to temperature irregularities caused by the accumulated films. In addition, the accumulated films may cause particle issues on processed substrates.

Traditional preventative reaction chamber maintenance may need periodic replacement of parts for the reaction chamber. This may result in significant down time (on the order of 1 week or more), causing a high loss in production.

Accordingly, apparatuses and methods are desired to clean deposited molybdenum or molybdenum nitride films from walls of reaction chambers that do not require a significant down time in production.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In at least one embodiment of the invention, a method for cleaning an interior wall of a reaction chamber is disclosed. The method comprises: providing a reaction chamber in which a molybdenum film is deposited on an interior wall of the reaction chamber; igniting a remote plasma unit by flowing an inert gas into the remote plasma unit; flowing a halide precursor into the remote plasma unit to form a radical gas; flowing the radical gas from the remote plasma unit into the reaction chamber, wherein the radical gas reacts with the molybdenum film; and flowing a purge gas to remove a by-product of the reaction of the radical gas with the molybdenum film from the reaction chamber; wherein the molybdenum film comprises at least one of: molybdenum; or molybdenum nitride.

In at least one embodiment of the invention, a reaction system for depositing a semiconductor film is disclosed. The reaction system comprises: a reaction chamber configured to hold a substrate to be processed, the reaction chamber having a deposited film on an interior of the reaction chamber, wherein the deposited film comprises at least one of: molybdenum or molybdenum nitride; a remote plasma unit; a halide precursor source configured to provide a halide gas to the remote plasma unit; an inert gas source configured to provide an inert gas to the remote plasma unit; a first reactant precursor source configured to provide a first reactant precursor to the reaction chamber, wherein the first reactant precursor does not enter the remote plasma unit; and a second reactant precursor or purge gas source configured to provide a second reactant precursor or a purge gas to the reaction chamber; wherein the remote plasma unit is configured to activate a mixture of the halide gas and the inert gas to form a radical gas that flows to the reaction chamber; and wherein the radical gas reacts with the deposited film to remove the deposited film from the reaction chamber.

In at least one embodiment of the invention, a batch reaction system for depositing a semiconductor film is disclosed. The reaction system comprises: a reaction tube configured to hold a substrate boat to be processed, the reaction tube having a deposited film on an interior of the reaction tube, wherein the deposited film comprises at least one of: molybdenum or molybdenum nitride; an in situ radical generator; a halide precursor source configured to provide a halide gas to the reaction tube; an inert gas source configured to provide an inert gas to the reaction tube; an oxygen gas source configured to provide an oxygen gas to the reaction tube; a first reactant precursor source configured to provide a first reactant precursor to the reaction tube; and a second reactant precursor source configured to provide a second reactant precursor to the reaction chamber; wherein the in situ radical generator is configured to activate the halide gas to form a radical gas in the reaction tube; and wherein the radical gas reacts with the deposited film to remove the deposited film from the reaction tube.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

Figure 1:
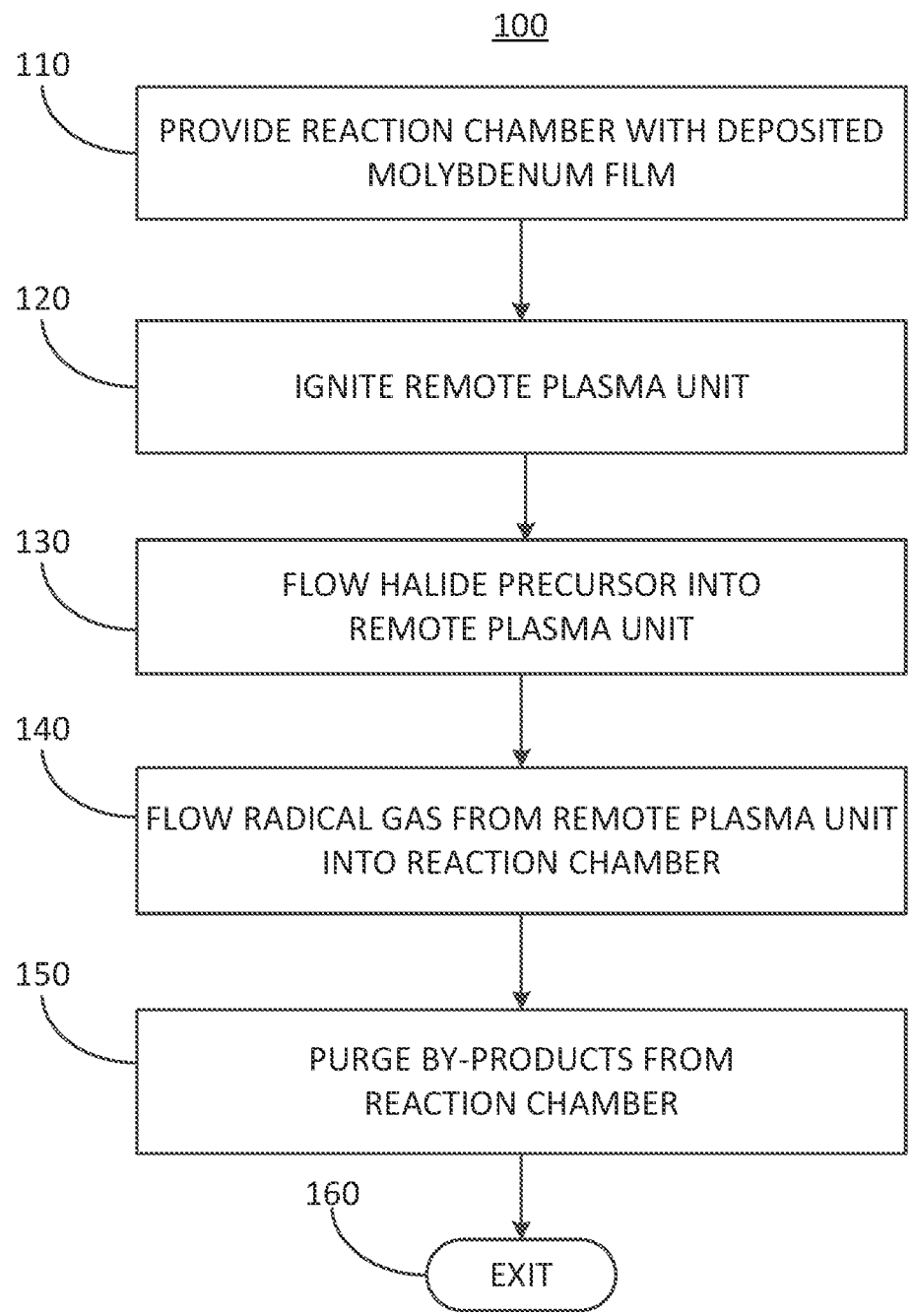
FIG. 1 illustrates a non-limiting exemplary process flow, demonstrating a method for cleaning a molybdenum or molybdenum nitride film from interior walls of a reaction chamber according to the embodiments of the disclosure.

The illustrations presented herein are not meant to be actual views of any particular material, structure, or device, but are merely idealized representations that are used to describe embodiments of the disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials that may be used, or upon which, a device, a circuit, or a film may be formed.

As used herein, the term "cyclical chemical vapor deposition" may refer to any process wherein a substrate is sequentially exposed to one or more volatile precursors, which react and/or decompose on a substrate to produce a desired deposition.

As used herein, the term "atomic layer deposition" (ALD) may refer to a vapor deposition process in which deposition cycles, preferably a plurality of consecutive deposition cycles, are conducted in a reaction chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "film" and "thin film" may refer to any continuous or non-continuous structures and material formed by the methods disclosed herein. For example, "film" and "thin film" could include 2D materials, nanolaminates, nanorods, nanotubes, or nanoparticles, or even partial or full molecular layers, or partial or full atomic layers or clusters of atoms and/or molecules. "Film" and "thin film" may comprise material or a layer with pinholes, but still be at least partially continuous.

A number of example materials are given throughout the embodiments of the current disclosure, it should be noted that the chemical formulas given for each of the materials should not be construed as limiting and that the non-limiting example materials given should not be limited by a given example stoichiometry.

The present disclosure includes an apparatus and method for cleaning a reaction system that performs a molybdenum film deposition process. Molybdenum thin films may be utilized in a number of applications, such as, for example, low electrical resistivity gap-fill, liner layers for 3D-NAND, DRAM word-line features, metal gate, DRAM top electrode, memory, or as an interconnect material in CMOS logic applications.

FIG. 1 illustrates a method 100 for cleaning a reaction system in accordance with at least one embodiment of the invention. The method 100 comprises: (1) providing a reaction chamber that has a deposited molybdenum film 110; (2) igniting a remote plasma unit 120; (3) flowing a halide precursor into the remote plasma unit 130; (4) flowing a radical gas formed in the remote plasma unit into the reaction chamber 140; and (5) purging by-products from the reaction chamber 150. The process then may exit in a step 160, whereby further processing steps occur, such as additional film deposition processes, cleaning processes, or annealing processes.

The deposited molybdenum film in step 110 may comprise molybdenum or molybdenum nitride. The igniting step 120 may comprise flowing an inert gas in to the remote plasma unit. The inert gas may comprise at least one of: argon; xenon; or another inert gas. The remote plasma unit employed may include one manufactured by MKS Instruments, Inc. or Lightwind Corporation.

Once the plasma is ignited, the flowing the halide precursor into the remote plasma unit step 130 occurs. The halide precursor may comprise at least one of: nitrogen trifluoride ($NF_3$); sulfur hexafluoride ($SF_6$); carbon tetrafluoride ($CF_4$); fluoroform ($CHF_3$); octafluorocyclobutane ($C_4F_8$); chlorine trifluoride ($ClF_3$); fluorine ($F_2$); or a combination of the above. This causes a formation of radical gases, comprising fluorine radicals, for example.

The formed radical gas is then flowed from the remote plasma unit into the reaction chamber in step 140. The reaction chamber may be maintained at temperatures ranging between 300° C. and 550° C., between 350° C. and 500° C., or between 400° C. and 450° C. Temperatures that are too high may result in an excessively reactive radical gas, causing removal of more than the molybdenum or molybdenum nitride films than desired.

A flow rate of the formed radical gas may affect a rate at which the removal of the molybdenum or molybdenum nitride film occurs. The flow rate may be affected by a flow rate of the inert gas provided to the remote plasma unit. A higher flow rate of the formed radical gas may allow for quicker removal of the film. This may reduce the downtime of the reaction chamber for maintenance. A higher flow rate of the formed radical gas may range between 1500 and 3000 sccm, between 2000 and 3000 sccm, or between 2500 to 3000 sccm.

However, there may be situations where a lower flow rate of the formed radical gas is desired. The lower flow rate may be desired for areas of the reaction chamber that are more difficult for the radical gas to reach. A lower flow rate will increase a residence time of the formed radical gas, allowing it to get to the harder-to-reach areas, such as the corners of the reaction chamber. This way, a thorough cleaning of the reaction chamber may be achievable. A lower flow rate of the formed radical gas may range between 50 to 500 sccm, between 100 to 300 sccm, or between 100 to 200 sccm.

The method 100 also comprises a step 150 for purging by-products from the reaction chamber. The radical gas reacts with the deposited molybdenum films and may form a gaseous by-product. These by-products are then removed from the reaction chamber by purging an inert gas. The inert gas may comprise at least one of: argon; xenon; nitrogen; or helium.

In at least one embodiment of the invention, fluorine radicals may be utilized to remove a molybdenum film deposited on an inner wall of the reaction chamber. The fluorine radicals are formed according to a first reaction in the remote plasma unit during step 130, utilizing nitrogen trifluoride ($NF_3$) as an exemplary halide precursor:

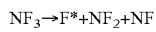

$NF_3 \rightarrow F^* + NF_2 + NF$

The fluorine radicals then react with the molybdenum film in this manner to form the by-products during step 140:

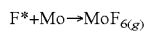

$F^* + Mo \rightarrow MoF_{6(g)}$

These by-products are then removed from the reaction chamber with the inert gas in step 150.

Reactors or reaction chambers suitable for performing the embodiments of the disclosure may include ALD reactors, as well as CVD reactors, configured to provide the precursors. According to some embodiments, a showerhead reactor may be used. According to some embodiments, single-wafer, cross-flow, batch, minibatch, or spatial ALD reactors may be used.

In some embodiments of the disclosure, a batch reactor may be used. In some embodiments, a vertical batch reactor may be used. In other embodiments, a batch reactor comprises a minibatch reactor configured to accommodate 10 or fewer wafers, 8 or fewer wafers, 6 or fewer wafers, 4 or fewer wafers, or 2 or fewer wafers.

Figure 2:
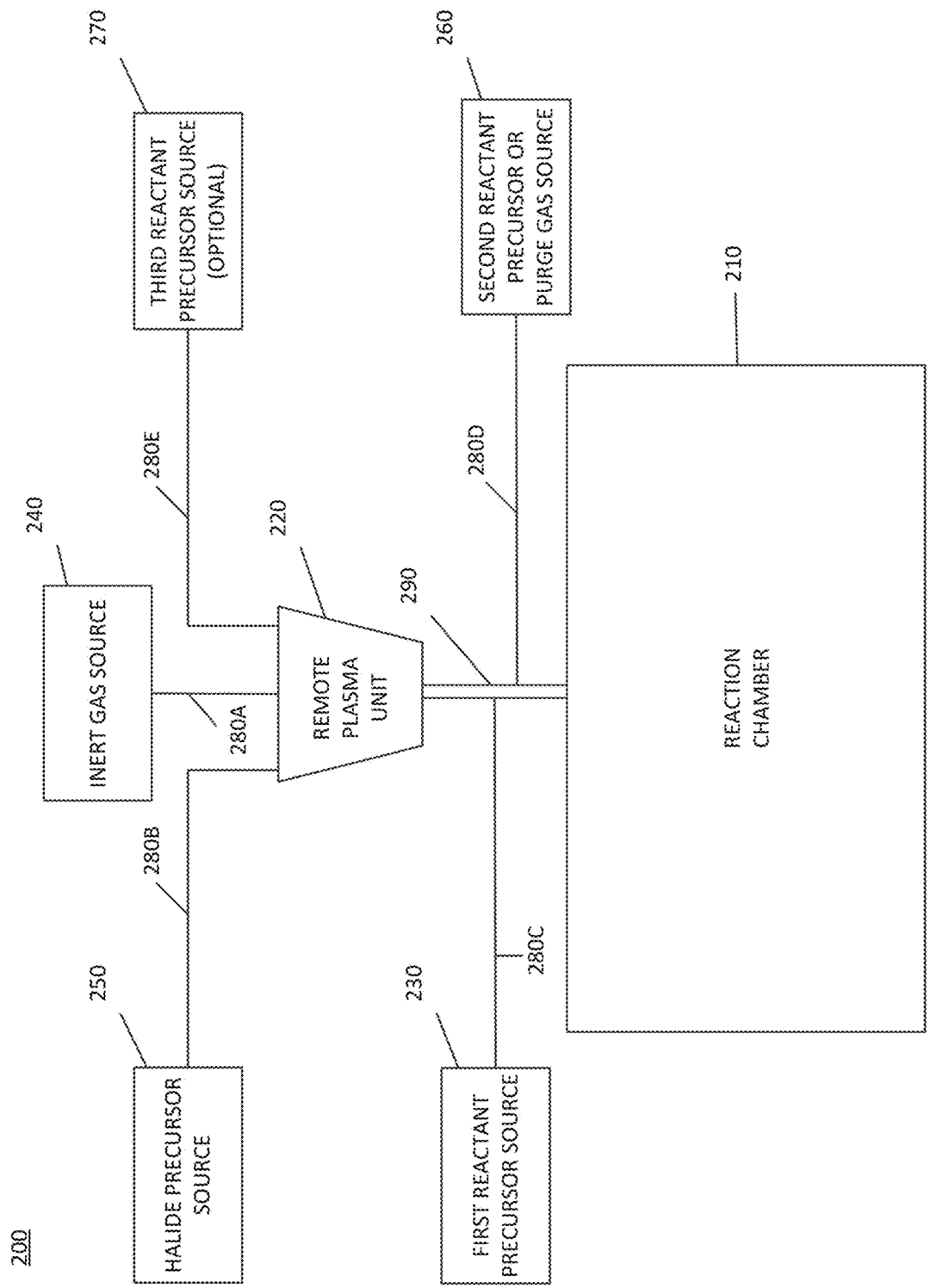
FIG. 2 illustrates a cross-sectional schematic diagram of a film deposition system according to the embodiments of the disclosure.

FIG. 2 illustrates a reaction system 200 in accordance with at least one embodiment of the invention. The reaction system 200 may comprise: a reaction chamber 210; a remote plasma unit 220; a first reactant precursor source 230; an inert gas source 240; a halide precursor source 250; a second reactant precursor or purge gas source 260; an optional third reactant precursor source 270; a series of gas lines 280A-280E; and a main gas line 290.

The reaction chamber 210 may have a shape and constitution depending on the type of reaction system 200 employed, whether it be a batch, single-wafer, or mini-batch tool, for example. The shape and constitution of the reaction chamber 210 may also depend on a process employed in the reaction system 200; for example, whether the process is an ALD or a CVD process.

The remote plasma unit 220 is ignited by an inert gas provided from the inert gas source 240 via the gas line 280A. The remote plasma unit 220 then activates a halide gas provided by the halide precursor source 250 via the gas line 280B. The halide gas from the halide precursor source 250 may comprise at least one of: nitrogen trifluoride ($NF_3$); sulfur hexafluoride ($SF_6$); carbon tetrafluoride ($CF_4$); fluoroform ($CHF_3$); octafluorocyclobutane ($C_4F_8$); chlorine trifluoride ($ClF_3$); fluorine ($F_2$); or a mixture of the above.

The activated halide gas and the inert gas form a radical gas that then travels to the reaction chamber 210 via the main gas line 290. The main gas line 290 may also comprise an injector system if the reaction system 200 is a batch or a mini-batch system. The main gas line 290 may also comprise a manifold, a showerhead, or an injection flange for a single-wafer system.

The reaction system 200 may also comprise a first reactant precursor source 230 that provides a first reactant precursor to the reaction chamber 210 via the gas line 280C in order to deposit a molybdenum film or a molybdenum nitride film. The first reactant precursor may comprise at least one of: a molybdenum halide precursor, such as a molybdenum chloride precursor, a molybdenum iodide precursor, or a molybdenum bromide precursor; or a molybdenum chalcogenide, such as a molybdenum oxychloride, a molybdenum oxyiodide, a molybdenum (IV) dichloride dioxide ($MoO_2Cl_2$) precursor, or a molybdenum oxybromide.

The reaction system 200 may also comprise a second reactant precursor or a purge gas source 260 that provides a reactant precursor or a purge gas via the gas line 280D. If the gas source 260 provides a purge gas, the purge gas may be utilized to remove by-products of the reaction between the deposited molybdenum or molybdenum nitride film and the radical gas as above described in step 150 of the method 100. If the gas source 260 provides a second reactant precursor, the second reactant precursor may react with the first reactant precursor from the first reactant precursor source 230 to deposit the molybdenum film or the molybdenum nitride film.

The reaction system 200 may also comprise an optional third reactant precursor source 270 that provides an optional third reactant to the remote plasma unit 220 via the gas line 280E. The optional third reactant is then activated and flows to the reaction chamber 210, where it may react with the first reactant precursor or the second reactant precursor to deposit the molybdenum film or the molybdenum nitride film. The optional third reactant precursor source 270 may be employed where an activated precursor is necessary, such as in low temperature deposition processes.

Figure 3:
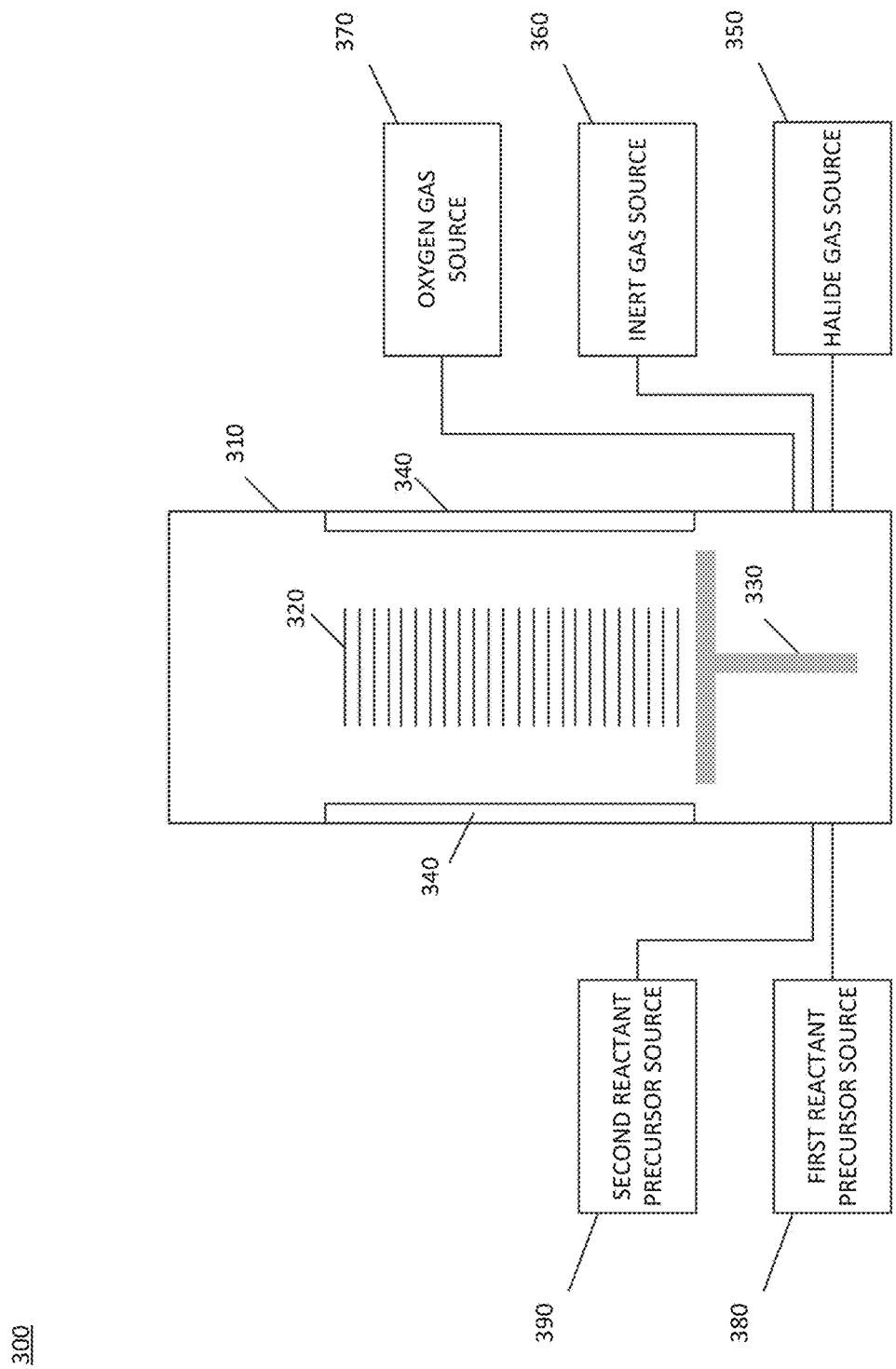
FIG. 3 illustrates a batch reactor system in accordance with at least one embodiment of the disclosure.

In at least one embodiment of the disclosures, a batch reactor system may be cleaned of a molybdenum or molybdenum nitride film deposited inside a reaction tube. FIG. 3 illustrates a batch reactor system 300 in accordance with at least one embodiment of the invention. The batch reactor system 300 comprises: a reaction tube 310; a boat of wafers 320; a wafer boat holder 330; an in situ radical generator 340; a halide gas source 350; an inert gas source 360; an oxygen gas source 370; a first reactant precursor source 380; and a second reactant precursor source 390.

The reaction tube 310 may comprise quartz and defines a reaction space in which a molybdenum film or a molybdenum nitride film is deposited on wafers disposed within the boat 320. The wafer boat holder 330 holds the wafer boat 320 and moves wafers into and out of the reaction tube 310. During the cleaning process, it may be preferable that the wafer boat 320 be outside of the reaction tube 310.

The in situ radical generator 340 may comprise an in situ plasma generator, such as an inductively coupled plasma (ICP) generator or a capacitively coupled plasma (CCP) generator. Alternatively, the in situ radical generator 340 may be optional as chemistries of the halide gas source 350 may prove to be unstable and naturally form radicals; for example, a metallic surface within the batch reactor system 300 may cause formation of radicals should it get in contact with an unstable halide gas such as nitrogen trifluoride ($NF_3$) or chlorine trifluoride ($ClF_3$).

The halide gas source 350 may provide a halide gas to the reaction tube 310 via gas line and an injector structure. The halide gas may comprise at least one of: nitrogen trifluoride ($NF_3$); chlorine trifluoride ($ClF_3$); fluorine ($F_2$); chlorine ($Cl_2$); or combinations of the above. The halide gas may be used to etch a layer of metallic molybdenum or molybdenum nitride formed on the quartz of the reaction tube 310. The flow of the halide gas may range between 10 sccm and 700 sccm, between 50 sccm and 600, or between 100 and 300 sccm. The flow rate of the halide gas should be such that damage to an interior of the batch reactor system 300 is limited when the halide gas is heated. The temperature within the reaction tube 310 during the clean process may range between 300° C. and 750° C., between 350° C. and 700° C., or between 400° C. and 600° C. The pressure within the reaction tube 310 during the clean process may range between 0.1 and 10 Torr, between 0.5 and 5 Torr, or between 1 and 3 Torr.

The inert gas source 360 may provide an inert gas to the reaction tube 310 via a gas line and injector structure. The inert gas may comprise at least one of: argon; xenon; nitrogen; or helium. The inert gas may function to activate in situ plasma within the reaction tube 310, should the in situ radical generator 340 comprise an in situ plasma generator. The activated in situ plasma then converts the halide gas into a radical gas. The inert gas may also be used to purge out any by-products from the reaction of the radical gas with the deposited molybdenum or molybdenum nitride films on the reaction tube 310. This process may allow for a greater selectivity to etch or clean the molybdenum or molybdenum nitride deposited on quartz in comparison to molybdenum or molybdenum nitride deposited on other surfaces.

Once the clean or etch process is completed, an annealing process with oxygen gas from the oxygen gas source 370 may be used to passivate the quartz material. The oxygen gas may comprise at least one of: oxygen ($O_2$); water vapor ($H_2O$); or hydrogen peroxide ($H_2O_2$). By passivating the quartz of the reaction tube 310, this avoids a memory effect during further molybdenum or molybdenum nitride deposition.

The first reactant precursor source 380 and the second reactant precursor source 390 may provide a first reactant precursor and a second reactant precursor used to deposit a molybdenum or molybdenum nitride film onto the wafers disposed in the wafer boat 310. The first reactant precursor may comprise at least one of: a molybdenum halide precursor, such as a molybdenum chloride precursor, a molybdenum iodide precursor, or a molybdenum bromide precursor; or a molybdenum chalcogenide, such as a molybdenum oxychloride, a molybdenum oxyiodide, a molybdenum (IV) dichloride dioxide ($MoO_2Cl_2$) precursor, or a molybdenum oxybromide.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for cleaning an interior wall of a reaction chamber, the method comprising:
   providing a reaction chamber in which a molybdenum film is deposited on an interior wall of the reaction chamber;
   forming a radical gas, wherein forming the radical gas consists essentially of:
      igniting a remote plasma unit by flowing an inert gas into the remote plasma unit, wherein the inert gas consists essentially of one or more of argon, helium, and nitrogen, and
      flowing a halide precursor into the remote plasma unit;
   flowing a gas consisting essentially of the radical gas into the reaction chamber, wherein the radical gas reacts with the molybdenum film; and
   flowing a purge gas to remove a by-product of the reaction of the radical gas with the molybdenum film from the reaction chamber;
   wherein the molybdenum film comprises at least one of: molybdenum; or molybdenum nitride.

2. The method of claim 1, wherein the reaction chamber is integral to at least one of: an atomic layer deposition (ALD) reaction system; a chemical vapor deposition (CVD) reaction system; a single-wafer deposition system; a batch wafer deposition system; a vertical furnace deposition system; a cross-flow deposition system; a minibatch deposition system; or a spatial ALD deposition system.

3. The method of claim 1, wherein the inert gas consists essentially of argon.

4. The method of claim 1, wherein the halide precursor consists essentially of one or more of nitrogen trifluoride ($NF_3$); sulfur hexafluoride ($SF_6$), carbon tetrafluoride ($CF_4$), fluoroform ($CHF_3$), octafluorocyclobutane ($C_4F_8$), chlorine trifluoride ($ClF_3$), or fluorine ($F_2$).

5. The method of claim 1, wherein the purge gas comprises at least one of: nitrogen ($N_2$); helium (He); or argon.

6. The method of claim 1, further comprising flowing a first reactant from a first reactant precursor source to deposit the molybdenum film.

7. The method of claim 6, wherein the first reactant comprises at least one of: a molybdenum halide precursor; a molybdenum chloride precursor; a molybdenum iodide precursor; a molybdenum bromide precursor; a molybdenum chalcogenide; a molybdenum oxychloride; a molybdenum oxyiodide; a molybdenum (IV) dichloride dioxide ($MoO_2Cl_2$) precursor; or a molybdenum oxybromide.

8. The method of claim 1, wherein the step of flowing the halide precursor is after the step of igniting a remote plasma unit.

9. The method of claim 1, wherein a temperature of the reaction chamber ranges between −350° C. and 500° C.

10. The method of claim 1, wherein flowing the radical gas has a high flow mode, achieved by flowing the radical gas at a flowrate ranging between 2500 and 3000 sccm.

11. The method of claim 1, wherein flowing the radical gas has a low flow mode, achieved by flowing the radical gas at a flowrate ranging between 100 to 300 sccm.

12. The method of claim 1, wherein the interior wall comprises a quartz surface.

13. The method of claim 12, further comprising passivating the quartz surface by flowing an oxygen-containing gas into the reaction chamber after the step of flowing a purge gas, wherein the oxygen-containing gas comprises at least one of: oxygen ($O_2$); water vapor ($H_2O$); or hydrogen peroxide ($H_2O_2$).

14. The method of claim 1, wherein the molybdenum film comprises molybdenum nitride.

15. The method of claim 1, wherein the halide precursor comprises one or more of fluoroform ($CHF_3$), octafluorocyclobutane ($C_4F_8$), or chlorine trifluoride ($ClF_3$).

16. The method of claim 9, wherein a pressure of the reaction chamber ranges between 1 and 3 Torr.

\* \* \* \* \*